United States Patent
Hsu

(10) Patent No.: US 9,484,117 B2
(45) Date of Patent: Nov. 1, 2016

(54) SEMICONDUCTOR MEMORY DEVICE HAVING COMPRESSION TEST MODE

(71) Applicant: Elite Semiconductor Memory Technology Inc., Hsinchu (TW)

(72) Inventor: Jen-Shou Hsu, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 559 days.

(21) Appl. No.: 13/859,539

(22) Filed: Apr. 9, 2013

(65) Prior Publication Data

US 2014/0301149 A1   Oct. 9, 2014

(51) Int. Cl.

| | |
|---|---|
| *G11C 29/00* | (2006.01) |
| *G11C 29/56* | (2006.01) |
| *G11C 29/14* | (2006.01) |
| *G11C 29/40* | (2006.01) |
| *G11C 29/48* | (2006.01) |
| *G11C 29/50* | (2006.01) |
| *G11C 29/12* | (2006.01) |

(52) U.S. Cl.
CPC .............. *G11C 29/56* (2013.01); *G11C 29/14* (2013.01); *G11C 29/40* (2013.01); *G11C 29/48* (2013.01); *G11C 29/1201* (2013.01); *G11C 29/50* (2013.01)

(58) Field of Classification Search
CPC ....... G11C 29/56; G11C 29/48; G11C 29/44; G11C 29/50; G11C 29/14
USPC .......................................... 714/718; 365/201
See application file for complete search history.

(56) References Cited

U.S. PATENT DOCUMENTS

| | | | | |
|---|---|---|---|---|
| 5,241,500 A * | 8/1993 | Barth, Jr. ................. | G11C 7/20 | 365/189.16 |
| 5,991,232 A * | 11/1999 | Matsumura ............. | G11C 29/46 | 365/189.08 |
| 6,301,169 B1 * | 10/2001 | Kikuda ................ | G11C 7/1006 | 365/189.02 |
| 6,643,805 B1 * | 11/2003 | Kikutake ............... | G11C 29/40 | 365/201 |
| 7,013,413 B1 * | 3/2006 | Kim ..................... | G11C 7/1051 | 714/48 |
| 7,046,563 B1 * | 5/2006 | Kim ....................... | G11C 29/40 | 365/189.04 |
| 7,692,993 B2 * | 4/2010 | Iida ....................... | G11C 11/406 | 365/201 |
| 8,051,342 B2 * | 11/2011 | Iioka ...................... | G11C 16/28 | 365/145 |
| 2001/0050870 A1 * | 12/2001 | Koshikawa ............... | G11C 8/08 | 365/201 |
| 2003/0081479 A1 * | 5/2003 | Matsumoto .......... | G11C 7/1006 | 365/201 |
| 2005/0166097 A1 * | 7/2005 | An ......................... | G11C 29/26 | 714/42 |
| 2006/0092681 A1 * | 5/2006 | Kawakubo ............ | G11C 29/12 | 365/52 |
| 2009/0273991 A1 * | 11/2009 | Song .................. | G11C 29/1201 | 365/191 |

* cited by examiner

*Primary Examiner* — Albert Decady
*Assistant Examiner* — Osman M Alshack
(74) *Attorney, Agent, or Firm* — Juan Carlos A. Marquez; Marquez IP Law Office, PLLC

(57) ABSTRACT

A semiconductor memory device having a compression test mode is provided. The semiconductor memory device comprises a memory unit, i test pads, a timing circuit, a compression circuit, and a signal distribution circuit. The memory unit comprises m memory banks divided into n activating groups, wherein each bank comprises a plurality of sensing amplifiers for sensing and amplifying data in bit lines. The timing circuit sequentially generates n control signals each for activating a plurality of sensing amplifiers in one of the n activating groups. The compression circuit compresses data sensed and amplified by the plurality of sensing amplifiers in each bank in a compression test mode. The signal distribution circuit distributes signals output from the compression circuit among the i data pads in rotation. The integer n and the integer i are adjustable.

20 Claims, 20 Drawing Sheets

SEMICONDUCTOR MEMORY DEVICE HAVING COMPRESSION TEST MODE

BACKGROUND OF THE INVENTION

1. Field of the Invention

The present invention relates to a semiconductor memory device having a compression test mode.

2. Description of the Related Art

Semiconductor memory devices are widely used in many electronic products and computer systems to store and retrieve data. Semiconductor memory devices have a variety of types, such as a random access memory (RAM), dynamic random access memory (DRAM), Synchronous DRAM (SDRAM), or a static RAM (SRAM).

Presently, semiconductor memory devices have become highly integrated. More than tens of millions of memory cells are integrated into a single semiconductor memory device so that much more data can be stored. During fabrication of the memory devices, the individual memory cells need to be tested. As the integration density of the memory devices increases, the test time taken to determine pass/fail of whole memory cells also increases.

One technique that is usually used to reduce test time is a compression test method. The compression test method is to compress data stored in a plurality of memory cells. Data read from the plurality of memory cells in each bank are compressed into some particular data bits or a single data bit by a data compression circuit included in the memory device. In a write operation of the data compression test, a tester provides identical data to the multiple memory banks through a communication channel. Then the data are read out from each bank and compressed by the compression circuit. Thereafter, the compress-data of the banks is output to the tester through the communication channel. In this manner, the tester can determine a pass or a fail of the memory device based on the compress-data and determine how to repair the fail bits, if necessary.

In the read operation of the conventional data compression test, all of the banks in the memory device are simultaneously activated. Therefore, the peak current required by the memory device is large and interference noise is introduced into the memory device accordingly. In addition, the compress-data of all of the banks is output to the communication channel at one time. Thus, it is difficult to determine whether a specific memory bank is normal or defective, such that the repair of a specific memory bank is impossible to implement.

Therefore, there is need to improve the data compression test on a semiconductor memory device.

SUMMARY OF THE INVENTION

One aspect of the present invention is to provide a semiconductor memory device having a compression test mode.

According to one embodiment of the present invention, the semiconductor memory device comprises a memory unit, i test pads, a timing circuit, a compression circuit, and a signal distribution circuit, wherein i is a positive integer having a value of 1 or greater. The memory unit comprises m memory banks divided into n activating groups, wherein each bank comprises a plurality of sensing amplifiers for sensing and amplifying data in bit lines, and m is a positive integer and n is a positive integer having a value of 1 or greater. The timing circuit sequentially generates n control signals each for activating a plurality of sensing amplifiers in one of the n activating groups. The compression circuit compresses data sensed and amplified by the plurality of sensing amplifiers in each bank in a compression test mode. The signal distribution circuit distributes signals output from the compression circuit among the i data pads in rotation. The integer n and the integer i are adjustable.

BRIEF DESCRIPTION OF THE DRAWINGS

The invention will be described according to the appended drawings in which.

DETAILED DESCRIPTION OF THE INVENTION

Figure 1:
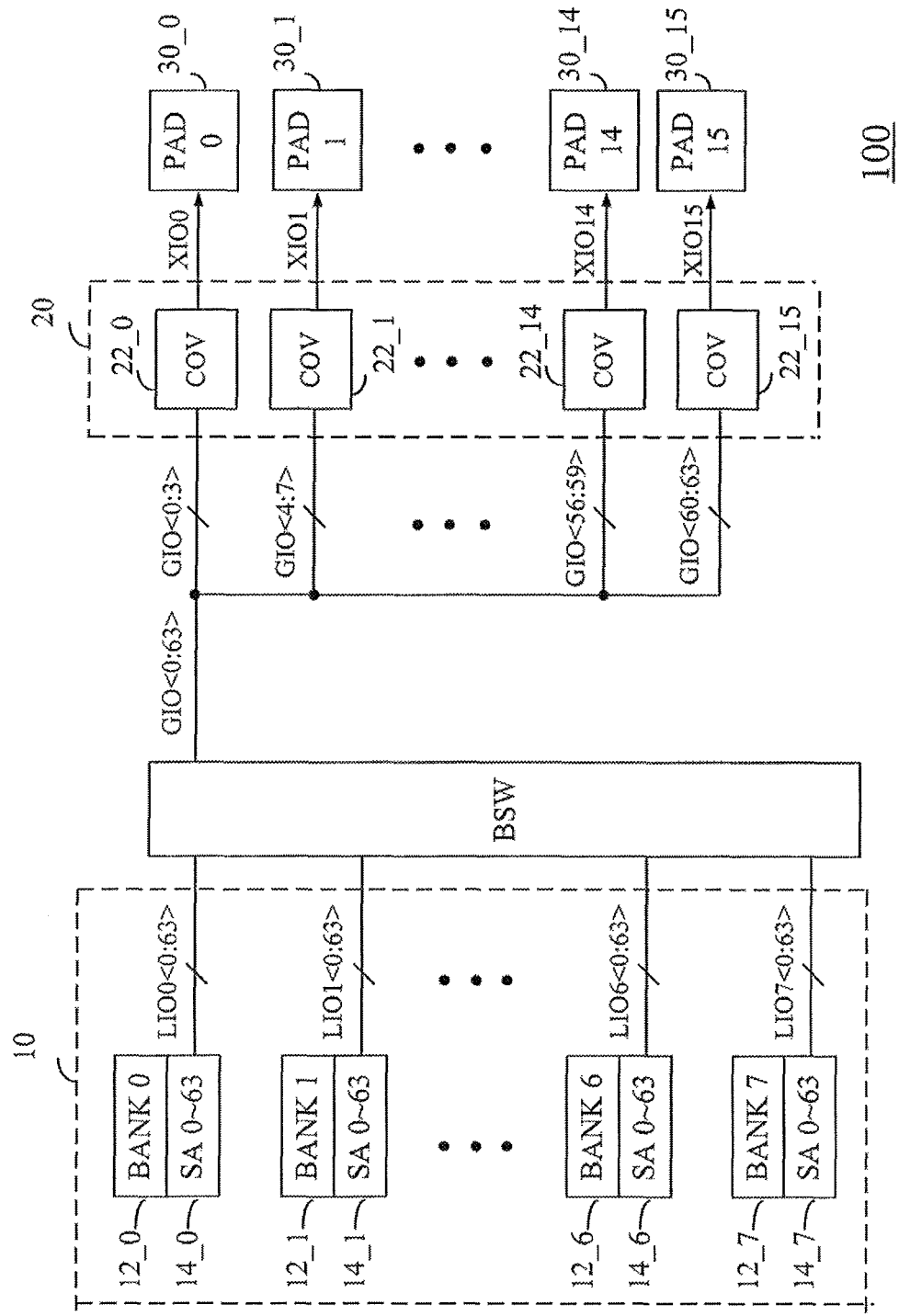
FIG. 1 is a block diagram illustrating a semiconductor memory device operated in a normal mode in accordance with an embodiment of the present invention.

FIG. 1 is a block diagram illustrating a semiconductor memory device 100 operated in a normal mode in accordance with an embodiment of the present invention. Referring to FIG. 1, the semiconductor memory device 100 comprises a memory unit 10, a bank select switching unit BSW, a converting unit 20, and a plurality of data pads 30_n.

The type of the semiconductor memory device 100 illustrated in this embodiment is a DDR2 SDRAM. Referring to FIG. 1, the memory unit 10 in the semiconductor memory device 100 comprises eight banks 12_0 to 12_7 and sixteen data pads 30_0 to 30_15. The memory device 100 in this embodiment can input/output data through the first to sixteenth data pads 300 to 30_15 in the normal mode. For the purpose of conciseness, only the first bank 12_0, the second bank 12_1, the seventh bank 12_6, and the last bank 12_7, the first pad 300, the second pad 30_1, the fifteenth pad 30_14, and the last pad 30_15 are illustrated in FIG. 1.

Referring to FIG. 1, each of the banks comprises a plurality of sensing amplifiers SA 0~63 for sensing and amplifying data in bit lines. For convenience, a reference numeral "14_0" is assigned to the sensing amplifiers for the first bank 12_0, a reference numeral "14_1" is assigned to the sensing amplifiers for the second bank 12_1, a reference numeral "14_6" is assigned to the sensing amplifiers for the seventh bank 12_6, and a reference numeral "14_7" is assigned to the sensing amplifiers for the last bank 12_7.

Referring to FIG. 1, a local I/O bus is provided only to the corresponding sensing amplifiers in each bank. For example, data outputted from the first bank 12_0 are sensed and amplified by the 64 sensing amplifiers 14_0 and then provided to the local I/O bus LIO0<0:63>, and data outputted from the second bank 12_1 are sensed and amplified by the 64 sensing amplifiers 14_1 and then provided to the local I/O bus LIO1<0:63>. Referring to FIG. 1, each of the local I/O buses LIO0<0:63>, LIO1<0:63>, . . . , LIO6<0:63>, and LIO7<0:63> is composed of the sixty-four local I/O lines. Therefore, 1-bit data is loaded on one local I/O line at a time.

The first to eighth local I/O buses LIO0<0:63>, LIO1<0:63> . . . LIO6<0:63>, and LIO7<0:63> are connected to a global I/O bus GIO<0:63> through the bank select switching unit BSW. Referring to FIG. 1, the global I/O bus GIO<0:63> are provided in common to the first to eighth memory bank 12_0 to 12_7. The global I/O bus GIO<0:63> is composed of the sixty-four global I/O lines, and 1-bit data is loaded on one global I/O line at a time. In the normal mode, only a selected bank is operated, so that the sensing amplifiers in the selected bank are activated to provide data to the global I/O bus GIO<0:63> through the switching unit BSW. For example, if the first bank 12_0 is selected to be operated, 64-bit data loaded on the local I/O bus LIO0<0:63> is transferred to the global I/O bus GIO<0:63> through the switching unit BSW. Next, if the second bank 12_1 is selected to be operated, 64-bit data loaded on the local I/O bus LIO1<0:63> is transferred to the global I/O bus GIO<0:63> through the switching unit BSW. Therefore, the data loaded on the global I/O bus GIO<0:63> are corresponding to only one of the memory bank 12_0 to 12_7 at a time in the normal mode.

Referring to FIG. 1, the converting unit 20 comprises a plurality of converting circuits COV 22_0 to 22_15. As is known to those skilled in the art, the DDR2 SDRAM adopts a 4-bit prefetch operation to output 4-bit data to a data pad during two clock cycles. Therefore, in a normal mode read operation, each of the converting circuits COV 22_0 to 22_15 receives 4-bit parallel data loaded on four global I/O lines and converts them into serial form. Thereafter, the output signals of the first to sixteenth converting circuits COV 22_0 to 22_15 are output to the outside through the first to sixteenth data pads 30_0 to 30_15. In a normal mode write operation, each of the converting circuits COV 22_0 to 22_15 receives serial data from the first to sixteenth data pads 30_0 to 30_15 and converts them into parallel form. Thereafter, the output signals of the first to sixteenth converting circuits COV 22_0 to 22_15 are output to the global I/O bus GIO<0:63>.

Figure 2:
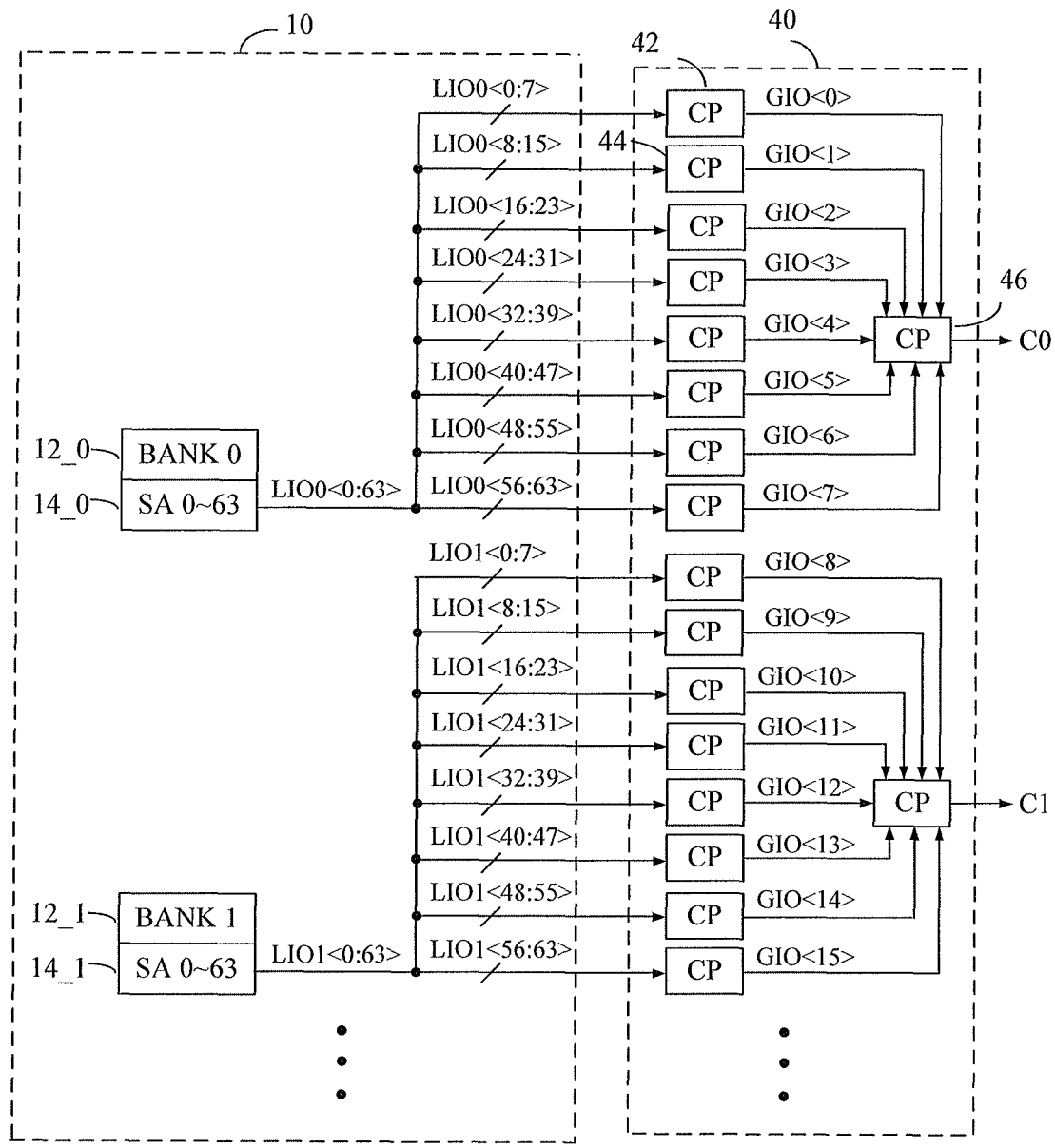
FIG. 2 is a circuit diagram illustrating a part of the semiconductor memory device operated in a compression test mode in accordance with an embodiment of the present invention.

FIG. 2 is a circuit diagram illustrating a part of the semiconductor memory device 100 operated in a compression test mode in accordance with an embodiment of the present invention. Referring to FIG. 2, the memory device 100 comprises the memory unit 10 and a compression circuit 40. When the memory device 100 operates in the compression test mode, identical data are simultaneously written into the activated banks in the memory unit 10. Thereafter, a portion of the banks are simultaneously activated, and the data are simultaneously read out from the activated banks and compressed by the compression circuit 40.

For the purpose of conciseness, only the first bank 120 and the second bank 12_1 are illustrated in FIG. 2. In a compression test mode read operation, the switches in the bank select switching unit BSW (not shown) are all deactivated. Therefore, data loaded on the first to eighth local I/O buses LIO0<0:63>, LIO1<0:63> . . . LIO6<0:63>, LIO7<0:63> are not transferred to the global I/O bus GIO<0:63> through the switching unit BSW. Referring to FIG. 2, the compression circuit 40 compresses the data loaded on the local I/O buses LIO0<0:63> and LIO1<0:63>, and outputs two 1-bit compress-data C0 and C1. Therefore, the signals C0 and C1 represent the compression results of the banks 12_0 and 12_1, respectively.

Referring to FIG. 2, the compression circuit 40 comprises a plurality of compressors CP. In this embodiment, each of the compressors CP in the compression circuit 40 is an 8-to-1 compressor. That is, each of the compressors CP can compress 8-bit parallel data loaded on eight local I/O lines and outputs 1-bit compress-data to a corresponding global I/O line. For example, the compressor CP 42 compresses the data loaded on the local I/O lines LIO0<0:7> and outputs 1-bit compress-data to the global line GIO<0>, and the compressor CP 44 compresses the data loaded on the local I/O lines LIO0<8:15> and outputs 1-bit compress-data to the global line GIO<1>. In this manner, the compress-data read out from the bank 12_0 are loaded on the global lines GIO<0:7>, and the compress-data read out from the banks 12_1 are loaded on the global lines GIO<8:15>. Therefore, the compression results of the first to eighth banks 120 to 12_7 can be successively loaded on the global IO bus GIO<0:63>.

In this embodiment, the memory unit 10 comprises eight memory banks 12_0 to 12_7, eight local I/O buses LIO0<0:63> to LIO7<0:63>, and one global I/O bus GIO<0:63>. However, the number of the memory banks, the number of the local I/O buses, and the number of the global I/O buses may be adjusted according to the design. For examples, when the memory unit 10 comprises four memory banks 12_0 to 12_3, four local I/O buses LIO0<0:63> to LIO3<0:63>, and one global I/O bus GIO<0:63>, the compression results of first to fourth banks 12_0 to 12_3 are loaded on parts of the global I/O buses GIO<0:63> such as the first to $32^{th}$ global lines GIO<0> to GIO<31>.

Figure 3:
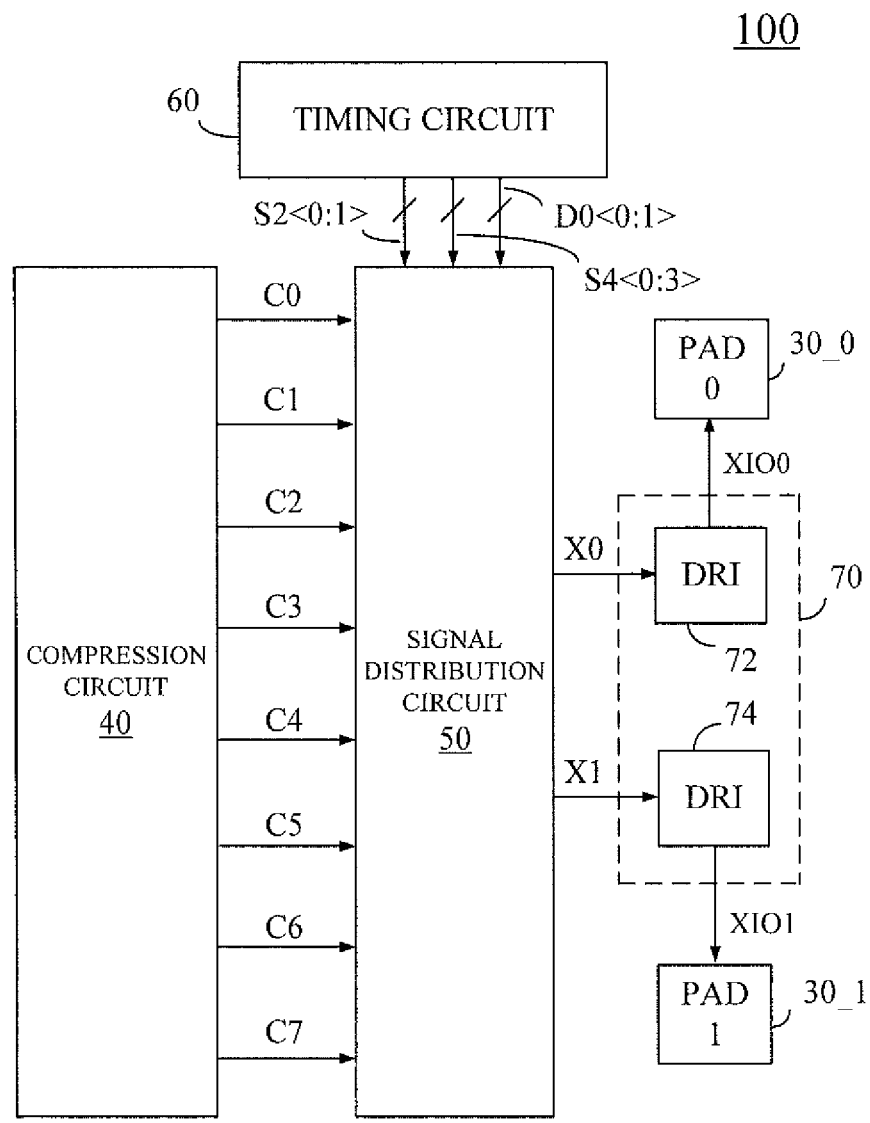
FIG. 3 is a block diagram illustrating a part of the semiconductor memory device operated in the compression test mode in accordance with an embodiment of the present invention.

FIG. 3 is a block diagram illustrating a part of the semiconductor memory device 100 operated in the compression test mode in accordance with an embodiment of the present invention. Referring to FIG. 3, the semiconductor memory device 100 comprises the compression circuit 40, a signal distribution circuit 50, a timing circuit 60, a driving unit 70, and the data pads 30_0 and 30_1.

In this embodiment, only two communication channels (not shown) are allocated from a test equipment (not shown) to test the semiconductor memory device 100 in a compression test. Therefore, only two data pads among the data pads 30_0 to 30_15 shown in FIG. 1 are used as test pads. Accordingly, the signal distribution circuit 50 is used to distribute signals C0 to C7 output from the compression circuit 40 among the test pads 30_0 and 30_1 in rotation, wherein the signals C0 to C7 represent the compression results of the banks 12_0 to 12_7. According to one embodiment of the present invention, the signal distribution circuit 50 outputs data in order of C0, C2, C4, and C6 to a line X0, and outputs data in order of C1, C3, C5, and C7 to a line X1. Thereafter, driving circuits (DRI) 72 and 74 in the driving unit 70 drive data loaded on the lines X0 and X1 to the outside through the test pads 30_0 and 30_1 in the compression test mode.

Figure 4:
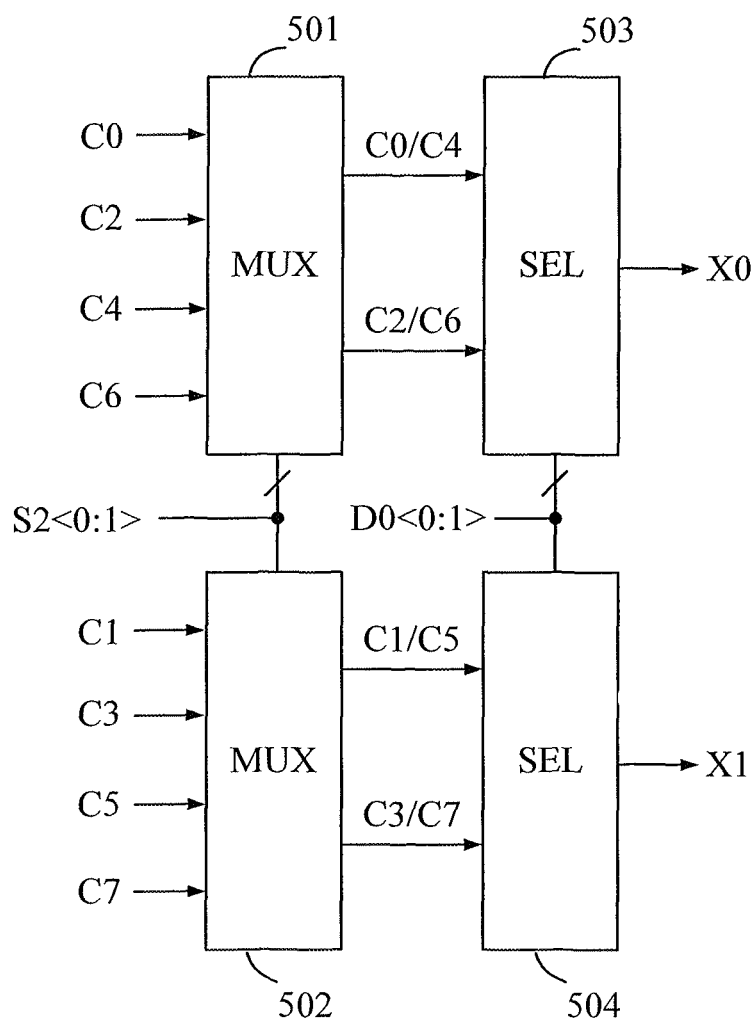
FIG. 4 is a block diagram illustrating the signal distribution circuit shown in FIG. 3 in accordance with an embodiment of the present invention.

FIG. 4 is a block diagram illustrating the signal distribution circuit 50 shown in FIG. 3 in accordance with an embodiment of the present invention. Referring to FIG. 4, the signal distribution circuit 50 comprises multiplexers (MUX) 501, 502 and selectors (SEL) 503, 504. The multiplexer 501 receives signals C0, C2, C4, and C6 output from the compression circuit 40, and the multiplexer 502 receives signals C1, C3, C5, and C7 output from the compression circuit 40. The selector 503 is connected between the multiplexer 501 and the driving circuit 72 shown in FIG. 3, and the selector 504 is connected between the multiplexer 502 and the driving circuit 74 shown in FIG. 3.

Figure 5:
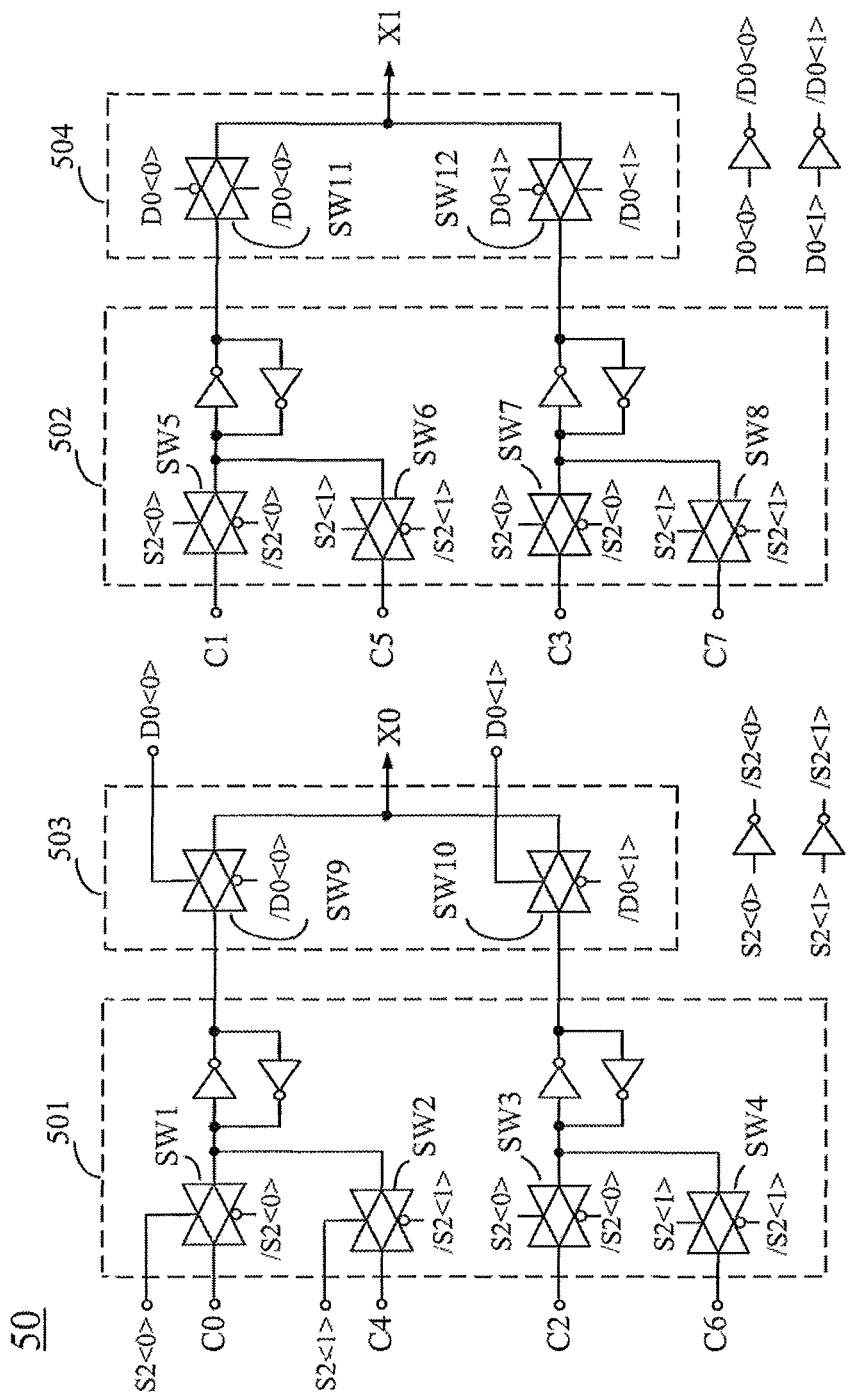
FIG. 5 is a circuit diagram illustrating the multiplexers and selectors in FIG. 4 in accordance with an embodiment of the present invention.

FIG. 5 is a circuit diagram illustrating the multiplexers 501, 502 and selectors 503, 504 in FIG. 4 in accordance with an embodiment of the present invention. Referring to FIG. 5, the multiplexer 501 comprises switches SW1, SW2, SW3, and SW4 and the multiplexer 502 comprises switches SW5, SW6, SW7, and SW8, wherein the switches SW1 to SW8 are activated in response to signals S2<0> and S2<1> output from the timing circuit 60. The selector 503 comprises switches SW9 and SW10 and the selector 504 comprises switches SW11 and SW12, wherein the switches SW9 to SW12 are activated in response to signals D0<0> and D0<1> output from the timing circuit 60.

Figure 6:
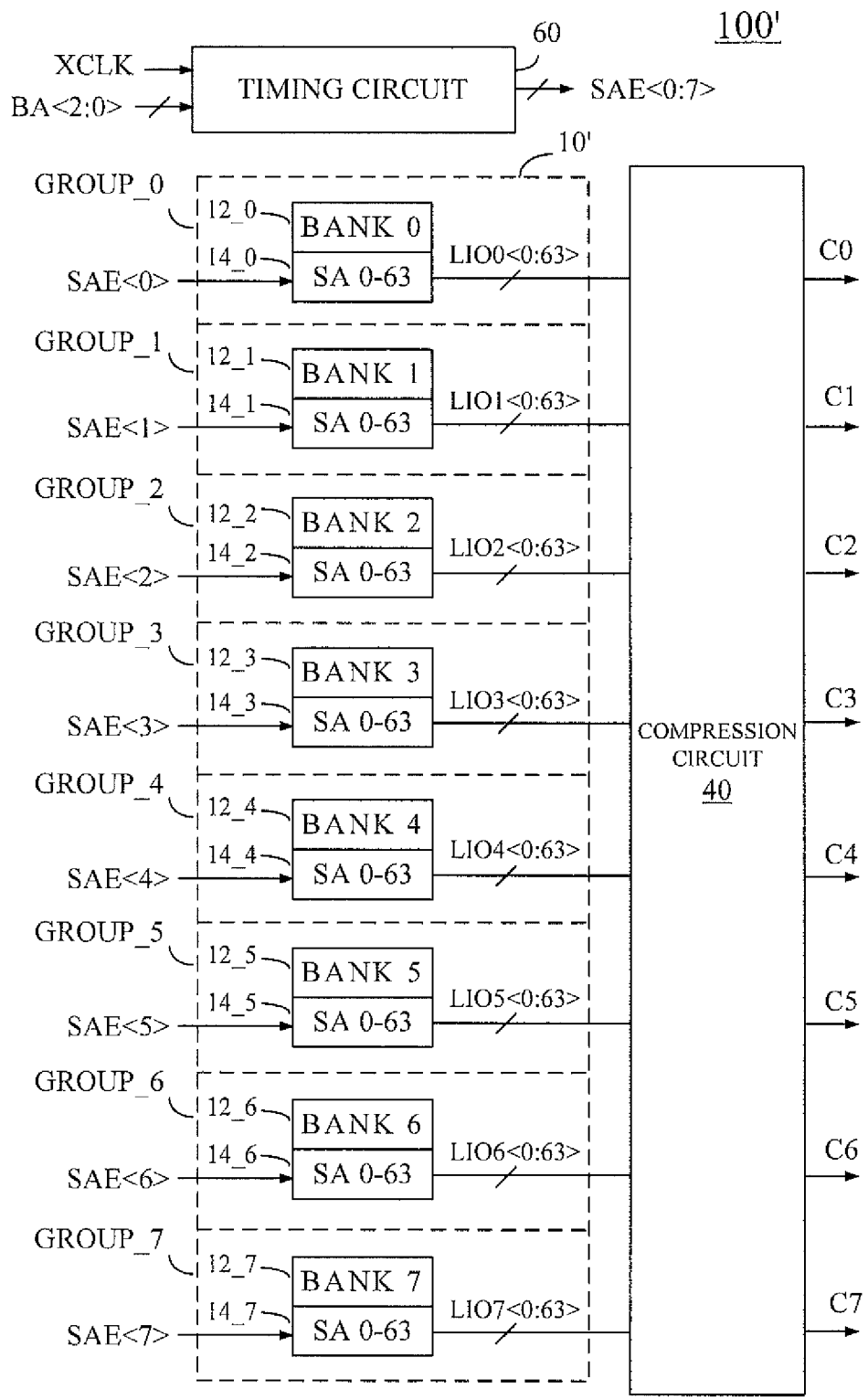
FIG. 6 is a block diagram illustrating a memory unit in accordance with an embodiment of the present invention.

As discussed earlier, the memory unit 10 according to one embodiment of the present invention comprises eight memory banks 12_0 to 12_7 as shown in FIG. 1. The memory banks 12_0 to 12_7 can be divided into a plurality of groups, wherein the sensing amplifiers in each group are simultaneously activated in response to activating signals SAE output from the timing circuit 60. FIG. 6 is a block diagram illustrating a memory unit 10' in accordance with an embodiment of the present invention. Circuits having similar functions to those in FIG. 1 and FIG. 3 are denoted by the same reference numerals. Referring to FIG. 6, the memory banks 12_0 to 12_7 in the memory unit 10' are divided into first to eighth groups GROUP_0 to GROUP_7. Therefore, each group is composed of one memory bank.

Figure 7:
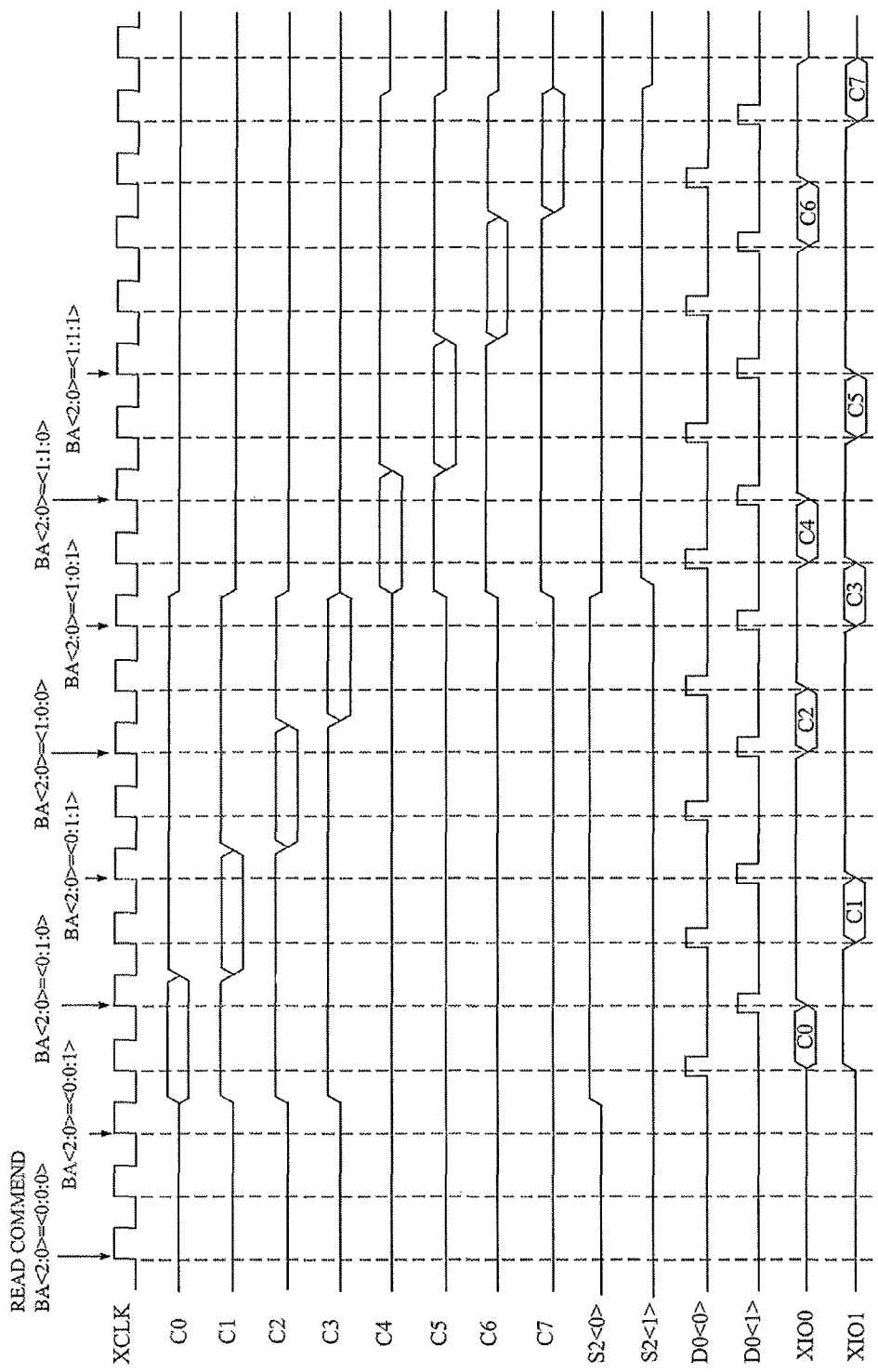
FIG. 7 is a timing diagram illustrating an operation of the memory device of FIG. 6.

Referring to FIG. 6, a timing circuit 60' receives bank control signals BA<2:0> and a clock signal XCLK issued by a memory controller (not shown) and outputs a plurality of control signals SAE<0:7> to activate the sensing amplifiers in different groups. FIG. 7 is a timing diagram illustrating an operation of the memory device 100 of FIG. 6. Referring to FIG. 6 and FIG. 7, the first to eighth control signals SAE<0> to SAE<7> are sequentially activated to sequentially operate the sensing amplifiers in different groups. Therefore, the sensing amplifiers in the first group GROUP_0 are activated during the first two clock cycles, the sensing amplifiers in the second group GROUP_1 are activated during the two successive clock cycles, . . . , and the sensing amplifiers in the last group GROUP_7 are activated during the last two clock cycles.

Since the sensing amplifiers in different groups are activated in turn, the data read out from the banks in different groups are loaded on the local I/O buses LIO0<0:63> to LIO7<0:63> in sequence. The compression circuit 40 compresses the data loaded on the local I/O buses LIO0<0:63> to LIO7<0:63> and outputs the 1-bit compress-data C0 to C7 one by one as shown in FIG. 7. Since the memory device 100 is a DDR2 SDRAM device in this embodiment, each compress-data C0 to C7 is output to the signal distribution circuit 50 during two clock cycles and maintains a logic high level after that.

Please refer to FIG. 3 to FIG. 7. when any one of the signals C0, C1, C2, and C3 is activated, the signal S2<0> output from the timing circuit 60 is activated to a logic high level, so that the switches SW1, SW3, SW5, and SW7 in FIG. 5 turn on in response to the timing signal S2<0>. In this case, the signals C0 and C2 are transferred to the selector 503 through the switches SW1 and SW3, and the signals C1 and C3 are transferred to the selector 504 through the switches SW5 and SW7.

Referring to FIG. 7, the timing signals D0<0> and D0<1> output from the timing circuit 60 are activated every two clock cycles. The rising edges of the timing signal D0<0> lead the rising edges of the timing signal D0<1> by one clock cycle. Referring to FIG. 5 and FIG. 7, the signal C0 is activated during the first two clock cycles. Thereafter, the activated signal C0 is transferred to the line X0 when the first pulse of the timing signal D0<0> is generated. The signal C1 is activated during the two successive clock cycles. Thereafter, the activated signal C1 is transferred to the line X1 when the second pulse of the timing signal D0<0> is generated. The signal C2 is activated during the two successive clock cycles. Thereafter, the activated signal C2 is transferred to the line X0 when the third pulse of the timing signal D0<1> is generated. The signal C3 is activated during the two successive clock cycles. Thereafter, the activated signal C3 is transferred to the line X1 when the fourth pulse of the timing signal D0<1> is generated.

During the successive clock cycles, the signals C4, C5, C6, and C7 are sequentially activated every two clock cycles and the signal S2<1> output from the timing circuit 60 is activated to a logic high level. The switches SW2, SW4, SW6, and SW8 turn on in response to the timing signal S2<1>. Referring to FIG. 5 and FIG. 7, the activated signal C4 is transferred to the line X0 when the fifth pulse of the timing signal D0<0> is generated; the activated signal C5 is transferred to the line X0 when the sixth pulse of the timing signal D0<0> is generated; the activated signal C6 is transferred to the line X0 when the seventh pulse of the timing signal D0<1> is generated; and the activated signal C7 is transferred to the line X1 when the eighth pulse of the timing signal D0<1> is generated.

In the above embodiment, the memory banks 12_0 to 12_7 in the memory unit 10' are divided into eight groups GROUP_0 to GROUP_7. According to another embodiment of the present invention, the memory banks 12_0 to 12_7 in a memory unit 10" can be divided into four activating groups GROUP_0, GROUP_1, GROUP_2, and GROUP_3. Each of the groups GROUP_0, GROUP_1, GROUP_2, and GROUP_3 is composed of two memory banks as shown in FIG. 8.

Figure 8:
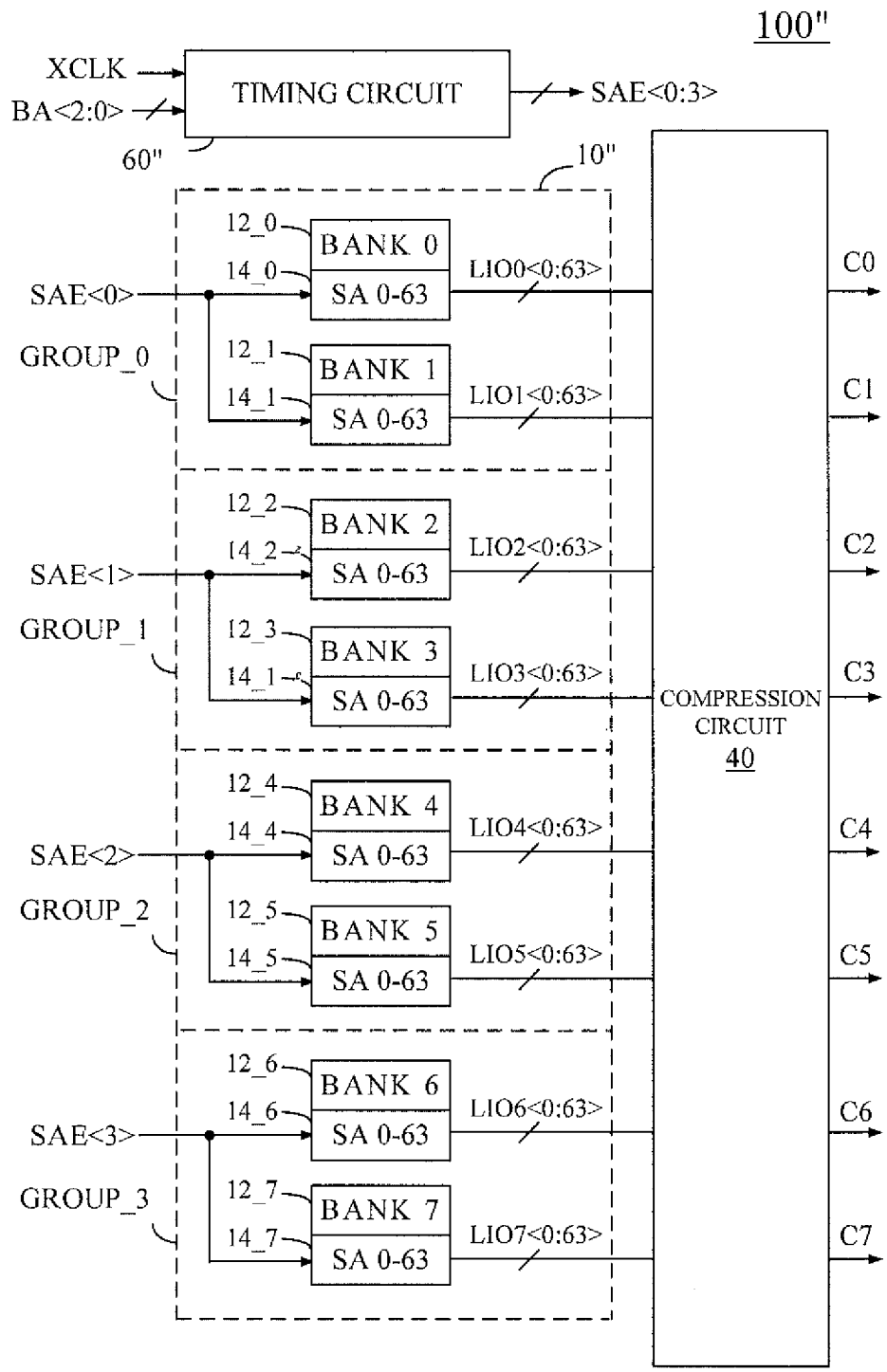
FIG. 8 is a block diagram illustrating a memory unit in accordance with an embodiment of the present invention.
Figure 9:
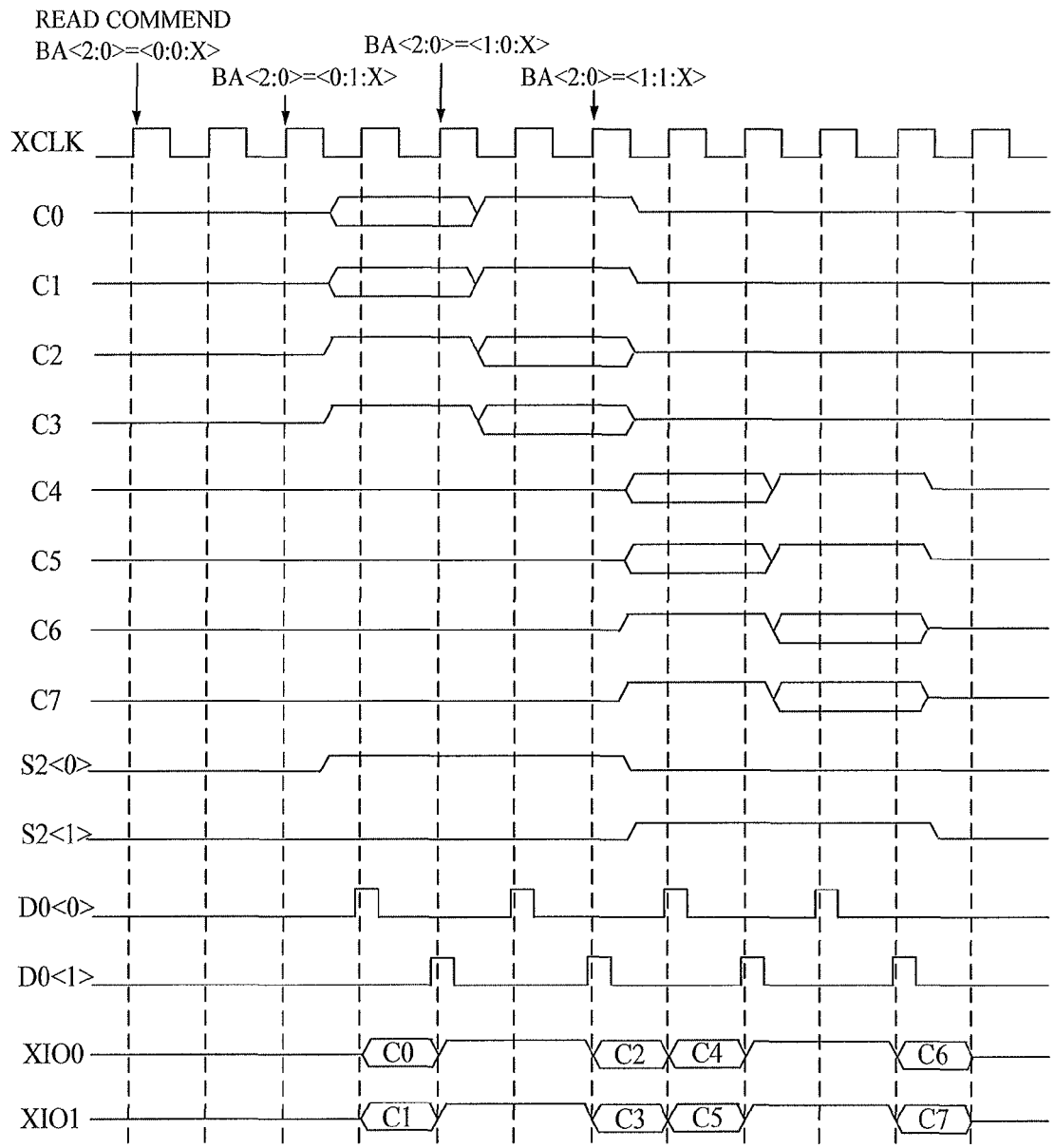
FIG. 9 is a timing diagram illustrating an operation of the memory device of FIG. 8.

Referring to FIG. 8, the timing circuit 60" sequentially generates four control signals SAE<0> to SAE<3> to sequentially operate the sensing amplifiers in different groups. FIG. 9 is a timing diagram illustrating an operation of the memory device 100" of FIG. 8. Referring to FIG. 8 and FIG. 9, the sensing amplifiers in the first group GROUP_0 are activated during the first two clock cycles. Therefore, the compress-data C0 and C1 are provided to the signal distribution circuit 50 during the first two clock cycles. The sensing amplifiers in the second group GROUP_1 are activated during the two successive clock cycles. Therefore, the compress-data C2 and C3 are provided to the signal distribution circuit 50 during the two successive clock cycles.

Referring to FIG. 9, when any one of the signals C0, C1, C2, and C3 is activated, the timing signal S2<0> output from the timing circuit 60" is activated to a logic high level. Referring to FIG. 5 and FIG. 9, when the first pulse of the timing signal D0<0> is generated, the activated signals C0 and C1 are transferred to the lines X0 and X1, respectively. When the second pulse of the timing signal D0<1> is generated, the activated signals C2 and C3 are transferred to the lines X0 and X1, respectively.

Referring to FIG. 8 and FIG. 9, the sensing amplifiers in the third GROUP_2 are activated during the two successive clock cycles, so that the compress-data C4 and C5 are generated accordingly. Thereafter, the sensing amplifiers in the last GROUP_3 are activated during the two successive clock cycles, so that the compress data C6 and C7 are generated accordingly. When any one of the signals C4 to C7 is activated, the timing signal S2<1> output from the timing circuit 60" is activated to a logic high level. Referring to FIG. 5 and FIG. 9, when the third pulse of the timing signal D0<0> is generated, the activated signals C4 and C5 are transferred to the lines X0 and X1, respectively. When the last pulse of the timing signal D0<1> is generated, the activated signals C6 and C7 are transferred to the lines X0 and X1, respectively.

Figure 10:
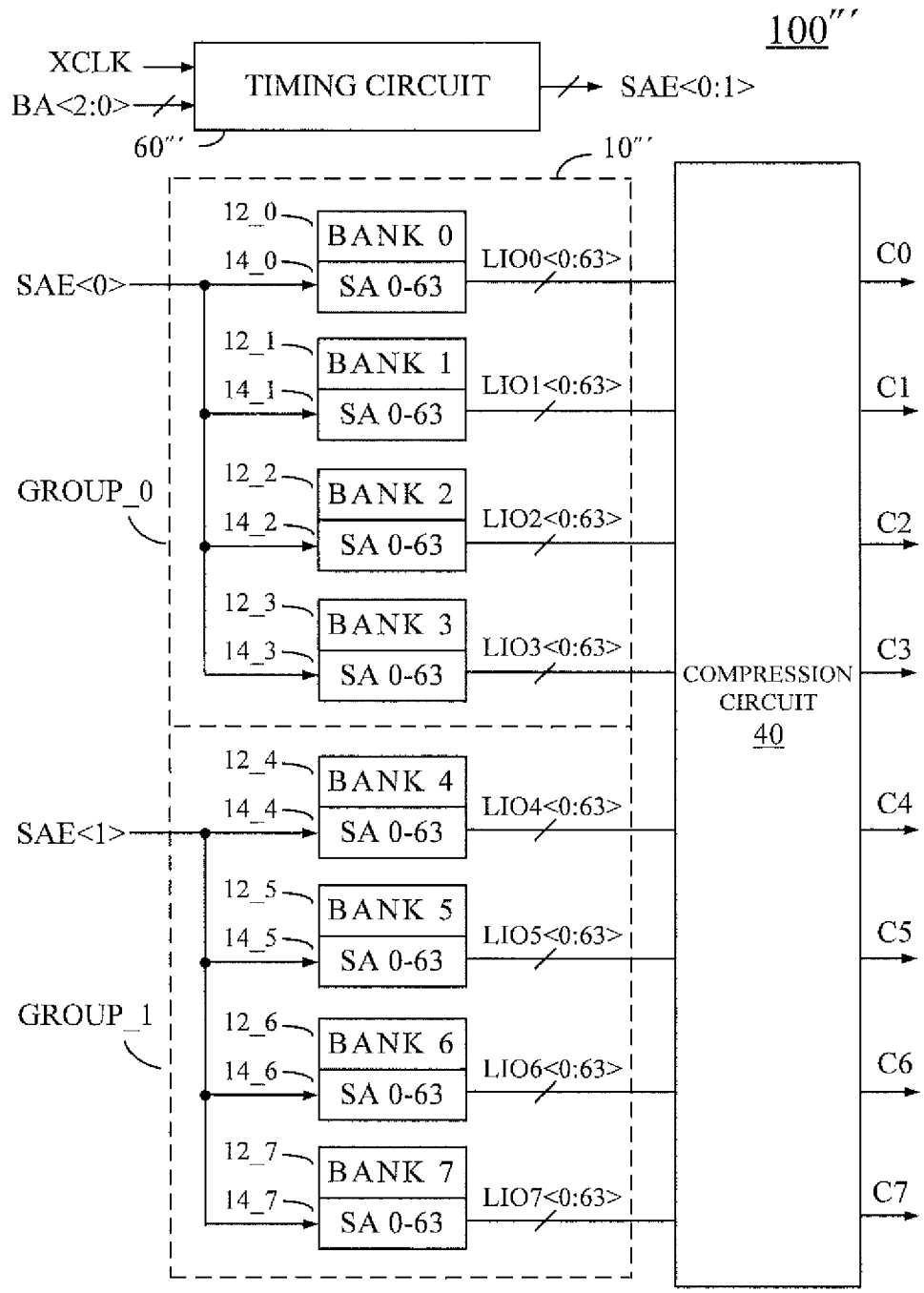
FIG. 10 is a block diagram illustrating a memory unit in accordance with an embodiment of the present invention.

According to yet another embodiment of the present invention, the first to eighth memory banks 12_0 to 12_7 in the memory unit 10''' are divided into two activating groups GROUP_0 and GROUP_1 as shown in FIG. 10. Each of the groups GROUP_0 and GROUP_1 is composed of four memory banks. Referring to FIG. 10, a timing circuit 60''' sequentially generates two control signals SAE<0> and SAE<1> to sequentially operate the sensing amplifiers in different groups.

Figure 11:
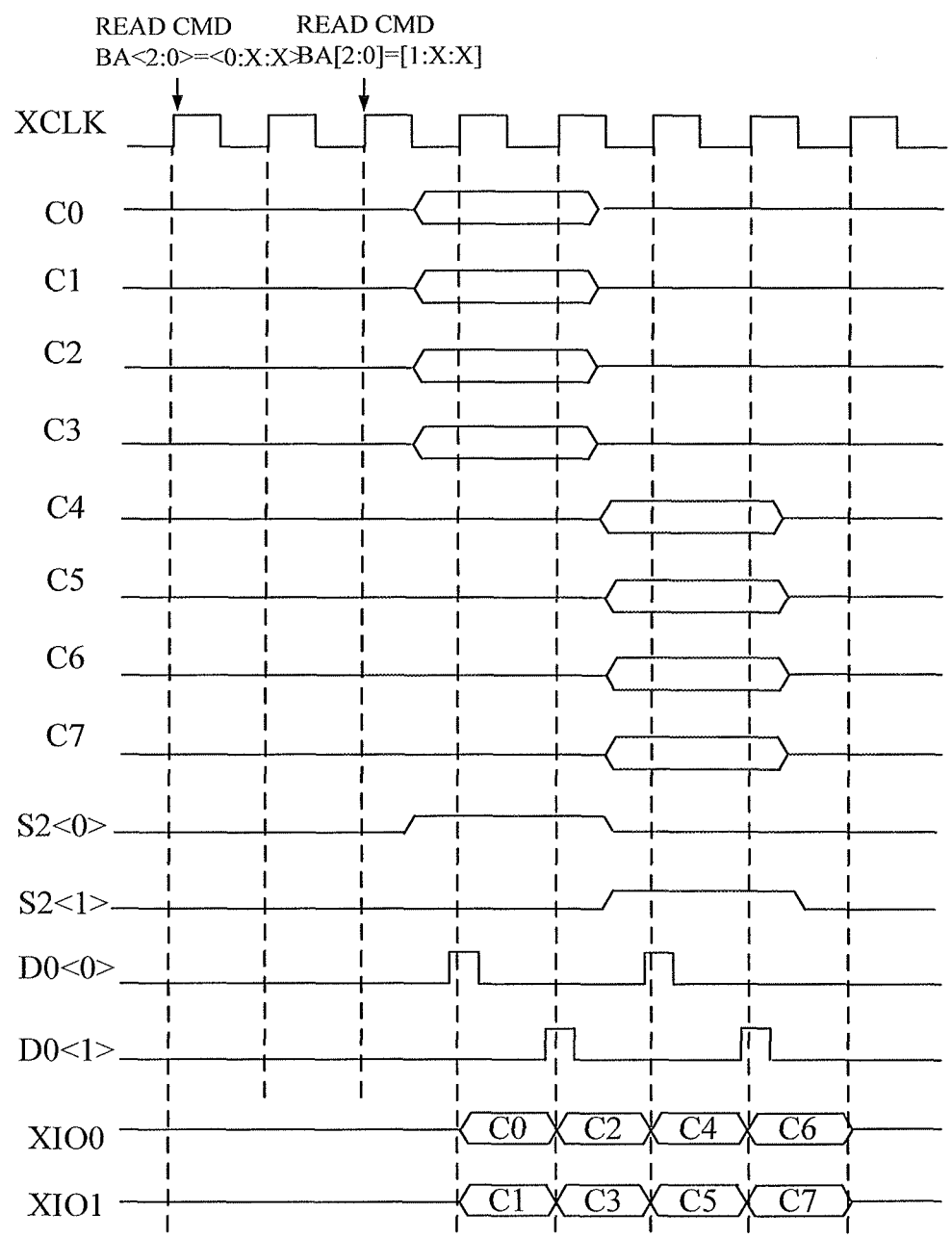
FIG. 11 is a timing diagram illustrating an operation of the memory device of FIG. 10.

FIG. 11 is a timing diagram illustrating an operation of the memory device 100''' of FIG. 10. Referring to FIG. 10 and FIG. 11, the sensing amplifiers in the first group GROUP_0 are activated during the first two clock cycles. Therefore, the compress-data C0, C1, C2, and C3 are provided to the signal distribution circuit 50 during the first two clock cycles. The sensing amplifiers in the second group GROUP_1 are activated is during the two successive clock cycles. Therefore, the compress-data C4, C5, C6, and C7 are provided to the signal distribution circuit 50 during the two successive clock cycles.

Referring to FIG. 11, when the signals C0, C1, C2, and C3 are activated, the signal S2<0> output from the timing circuit 60''' is activated to a logic high level. Referring to FIG. 5 and FIG. 11, when the first pulse of the timing signal D0<0> is generated, the activated signals C0 and C1 are transferred to the lines X0 and X1, respectively. When the first pulse of the timing signal D0<1> is generated, the activated signals C2 and C3 are transferred to the lines X0 and X1, respectively.

The sensing amplifiers in the second group GROUP_1 are activated during the two successive clock cycles, so that the compress data C4 to C7 are generated accordingly. When the signals C4 to C7 are activated, the timing signal S2<1> output from the timing circuit 60''' is activated to a logic high level. Referring to FIG. 9 and FIG. 11, when the second pulse of the timing signal D0<0> is generated, the activated signals C4 and C5 are transferred to the lines X0 and X1, respectively. When the second pulse of the timing signal D0<1> is generated, the activated signals C6 and C7 are transferred to the lines X0 and X1, respectively.

Figure 12:
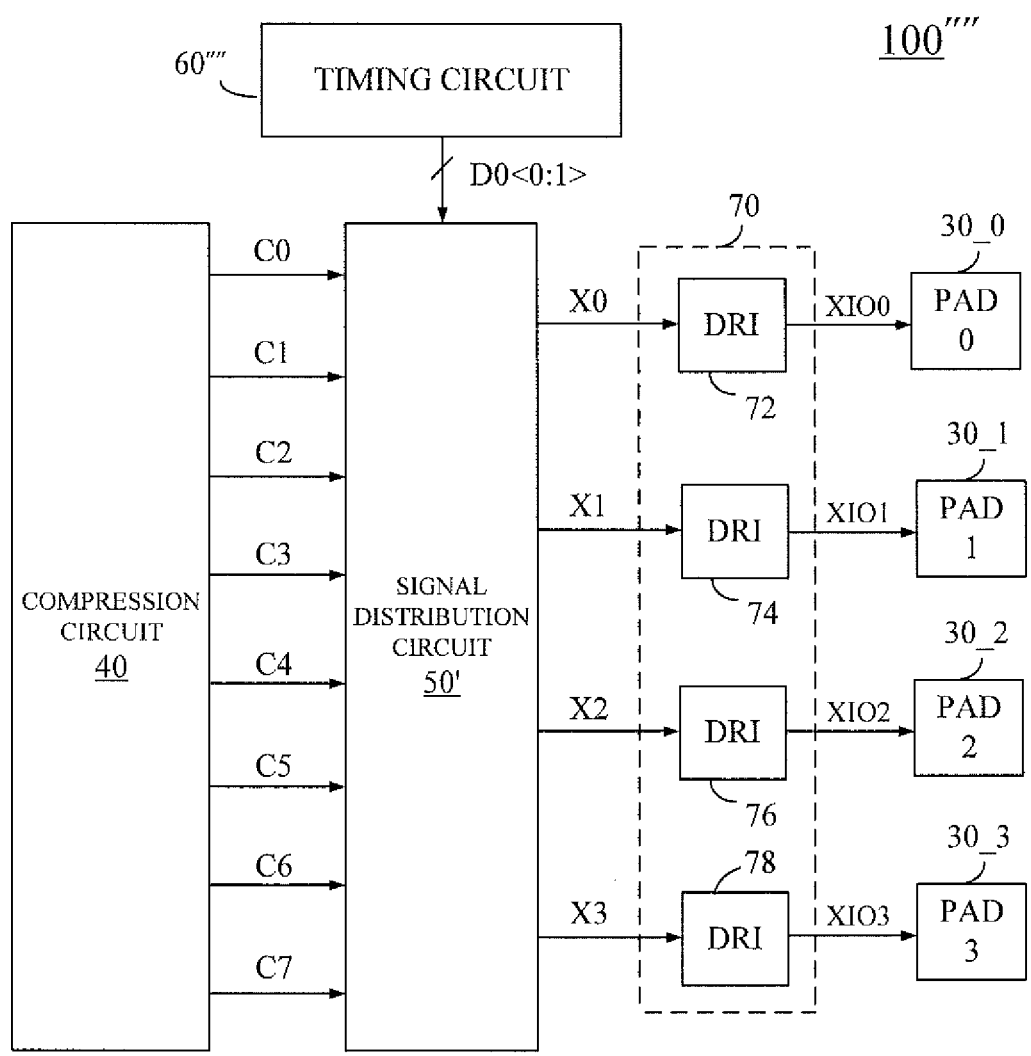
FIG. 12 is a block diagram illustrating a part of the semiconductor memory device operated in the compression test mode in accordance with another embodiment of the present invention.

In the above described embodiments, only two communication channels are allocated from the test equipment to test the semiconductor memory device 100 in the compression test. However, the present invention is not limited to such configuration. FIG. 12 is a block diagram illustrating a part of the semiconductor memory device operated in the compression test mode in accordance with another embodiment of the present invention. Circuits having similar functions to those in FIG. 3 are denoted by the same reference numerals and detailed descriptions thereof will be omitted. Referring to FIG. 12, four communication channels (not shown) are allocated from the test equipment to test the semiconductor memory device 100'''' in a compression test. Therefore, four data pads 30_0 to 30_3 among the data pads 30_0 to 30_15 shown in FIG. 1 are used as test pads.

Figure 13:
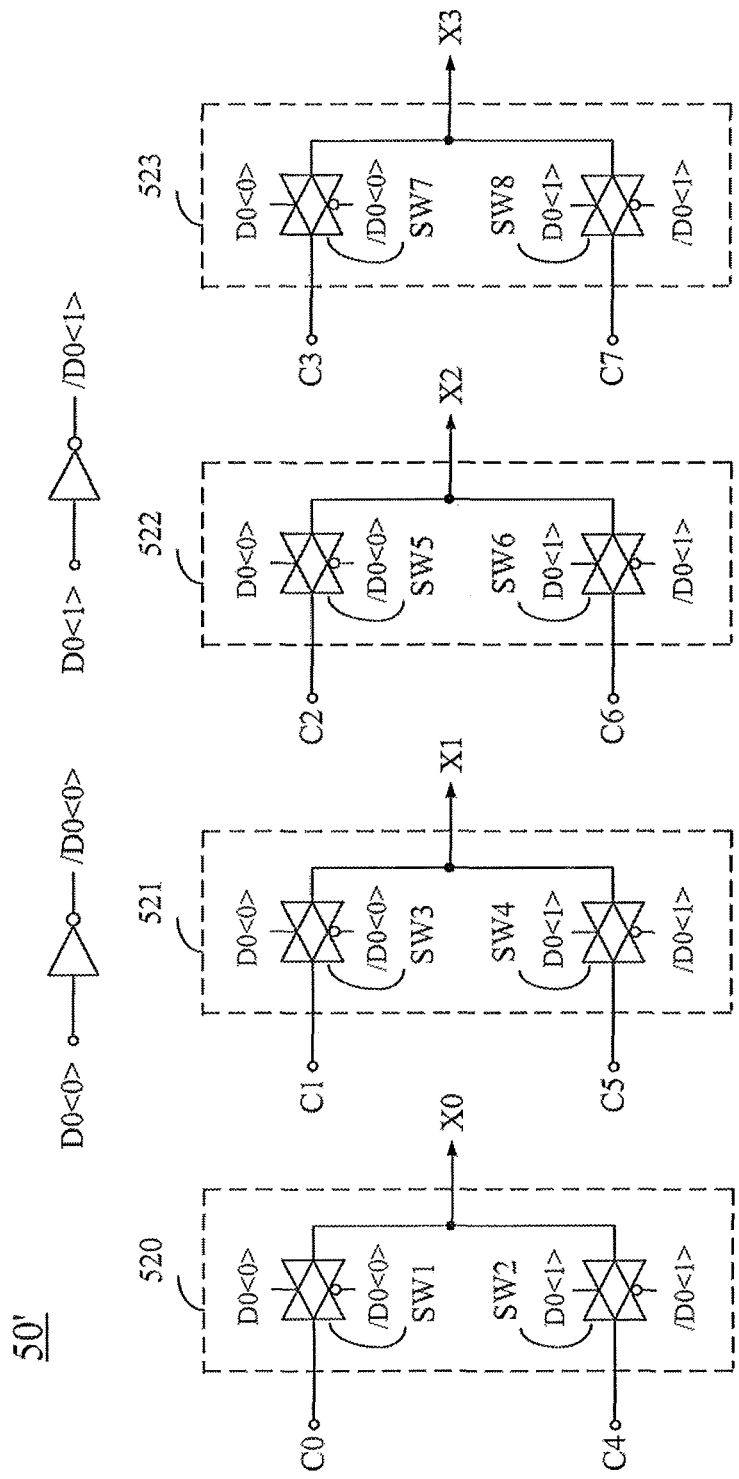
FIG. 13 is a circuit diagram illustrating the signal distribution circuit shown in FIG. 12 in accordance with an embodiment of the present invention.

Referring to FIG. 12, the signal distribution circuit 50' is used to distribute signals C0 to C7 output from the compression circuit 40 among the test pads 30_0 and 30_3 in rotation. FIG. 13 is a circuit diagram illustrating the signal distribution circuit 50' shown in FIG. 12 in accordance with an embodiment of the present invention. Referring to FIG. 13, the signal distribution circuit 50' comprises four selectors (SEL) 520, 521, 522, and 523. The first selector 520 receives signals C0 and C4 output from the compression circuit 40. The second selector 521 receives signals C1 and C5 output from the compression circuit 40. The third selector 522 receives signals C2 and C6 output from the compression circuit 40. The fourth selector 523 receives signals C3 and C7 output from the compression circuit 40.

Referring to FIG. 13, the selector 520 comprises switches SW1 and SW2. The compress-data C0 and C4 are transferred to the line X0 through the switches SW1 and SW2 in response to the timing signals D0<0> and D0<1>. The selector 521 comprises switches SW3 and SW4. The compress-data C1 and C5 are transferred to the line X1 through the switches SW3 and SW4 in response to the timing signals D0<0> and D0<1>. The selector 522 comprises switches SW5 and SW6. The compress-data C2 and C6 are transferred to a line X2 through the switches SW5 and SW6 in response to the timing signals D0<0> and D0<1>. The selector 523 comprises switches SW7 and SW8. The compress-data C3 and C7 are transferred to a line X3 through the switches SW7 and SW8 in response to the timing signals D0<0> and D0<1>.

Figure 14:
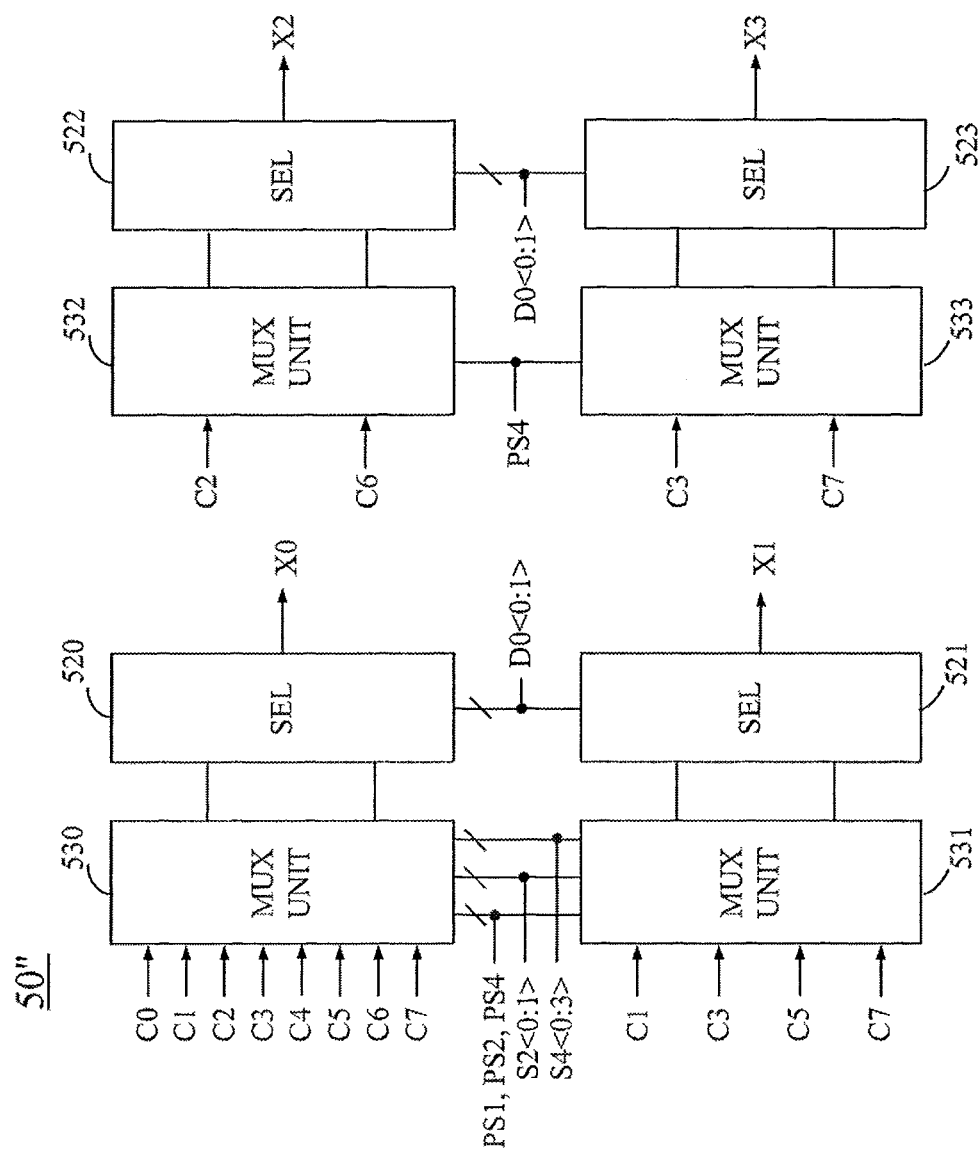
FIG. 14 is a block diagram showing an embodiment of the signal distribution circuit.

As mentioned above, the signal distribution circuit 50 is used to distribute signals C0 to C7 output from the compression circuit 40 among two test pads in rotation and the signal distribution circuit 50' is used to distribute signals C0 to C7 among four test pads in rotation, wherein the number of the test pads is selected to be equal to the number of the communication channels for testing the semiconductor memory device 100 in the compression test mode. However, if the number of the communication channels is varied depending on the test conditions, some additional switches are required to select data path. FIG. 14 is a block diagram showing an embodiment of a signal distribution circuit 50'', wherein the signal distribution circuit 50'' can distribute signals C0 to C7 among one, two test pads or four test pads according to the number of the communication channels.

Referring to FIG. 14, the signal distribution circuit 50" comprises first to fourth multiplexer units (MUX UNIT) 530, 531, 532, and 533 and first to fourth selectors 520, 521, 522, and 523 of FIG. 13. The first multiplexer unit 530 receives signals C0 to C7, the second multiplexer unit 531 receives signals C1, C3, C5, and C7, the third multiplexer unit 532 receives signals C2, and C6, and the fourth multiplexer unit 533 receives signals C3, and C7. The first selector 520 is connected between the first multiplexer unit 530 and the driving circuit 72 shown in FIG. 12, the second selector 521 is connected between the second multiplexer unit 531 and the driving circuit 74 shown in FIG. 12, the third selector 522 is connected between the third multiplexer unit 532 and the driving circuit 76 shown in FIG. 12, and the fourth selector 523 is connected between the fourth multiplexer unit 533 and the driving circuit 78 shown in FIG. 12.

Figure 15:
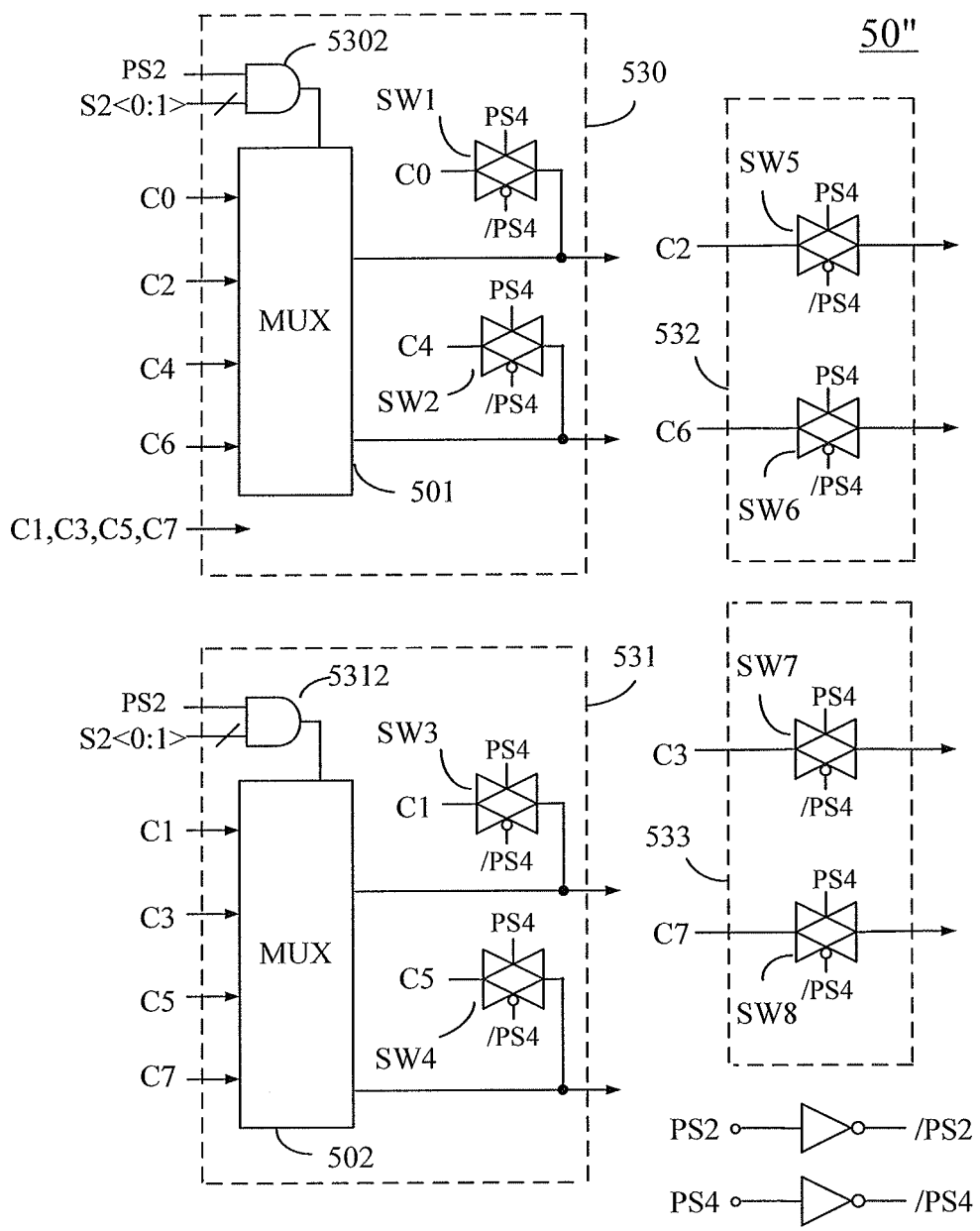
FIG. 15 is a circuit diagram showing an embodiment of the four multiplexers.

FIG. 15 is a circuit diagram showing an embodiment of the four multiplexer units 530, 531, 532, and 533 of the signal distribution circuit 50". In this embodiment, the signal distribution circuit 50" distributes signals C0 to C7 among two test pads or four test pads, and thus the signals C1, C3, C5, and C7 are of no use to the first multiplexer unit 530. Referring to FIG. 15, the first multiplexer unit 530 comprises two switches SW1 and SW2, an AND circuit 5302, and the multiplexer 501 of FIG. 5, the second multiplexer unit 531 comprises two switches SW3 and SW4, an AND circuit 5312, and the multiplexer 502 of FIG. 5, the third multiplexer unit 532 comprises two switches SW5 and SW6, and the fourth multiplexer unit 533 comprises two switches SW7 and SW8.

The operation of the signal distribution circuit 50" is described below in accordance with FIG. 14, and FIG. 15. In the compression test mode, if the compress-data of multiple memory banks are output to the test equipment through two communication channels, a pad select signal PS2 sent to the circuit 50" is activated to a logic high level and a pad select signal PS4 sent to the circuit 50" is activated to a logic low level. Under this condition, all the switches SW1 to SW8 in FIG. 15 are turned off, and the multiplexers 501 and 502 are activated in response to the signals S2<0:1>. The operation of the signal distribution circuit 50" is similar to that of the signal distribution circuit 50 of FIG. 4, and detailed descriptions thereof will be omitted.

On the other hand, if the compress-data of multiple memory banks are output to the test equipment through four communication channels, the pad select signal PS2 sent to the circuit 50" is activated to a logic low level and the pad select signal PS4 is activated to a logic high level, so that all the switches SW1 to SW8 are turned on. Under this condition, the multiplexer 501 and the multiplexer 502 are deactivated in response to a logic low level output from the AND circuit 5302 and 5312, respectively. The signals C0 and C4 are sent to the selector 520 through the switches SW1 and SW2, respectively. The signals C1 and C5 are sent to the selector 521 through the switches SW3 and SW4, respectively. The signals C2 and C6 are sent to the selector 522 through the switches SW5 and SW6, respectively. The signals C3 and C7 are sent to the selector 523 through the switches SW7 and SW8, respectively. The operation of the signal distribution circuit 50" is similar to that of the signal distribution circuit 50' of FIG. 13, and detailed descriptions thereof will be omitted.

Figure 16:
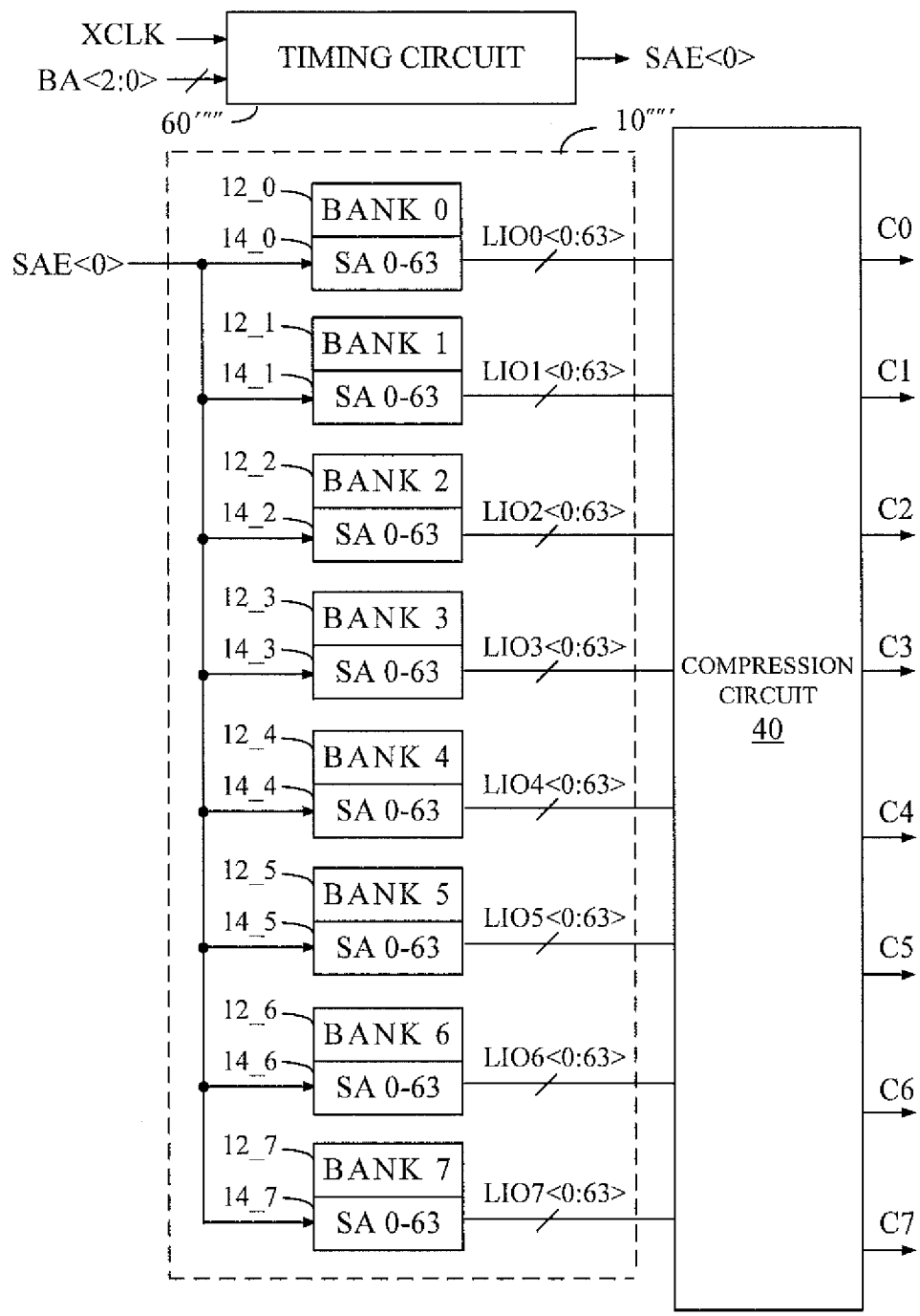
FIG. 16 is a block diagram illustrating the memory unit in accordance with an embodiment of the present invention.

As discussed earlier, the memory unit according to an embodiment of the present invention comprises eight memory banks 12_0 to 12_7 as shown in FIG. 1. The memory banks 12_0 to 12_7 in the memory unit 10 can be simultaneously activated in response to an activating signal SAE<0> output from the timing circuit 60''''. FIG. 16 is a block diagram illustrating the memory unit 10'''' in accordance with an embodiment of the present invention. Referring to FIG. 16, the timing circuit 60'''' receives bank control signals BA<2:0> and the clock signal XCLK issued by the memory controller (not shown) and outputs one control signals SAE<0> to activate all the sensing amplifiers in the memory unit 10''''.

Figure 17:
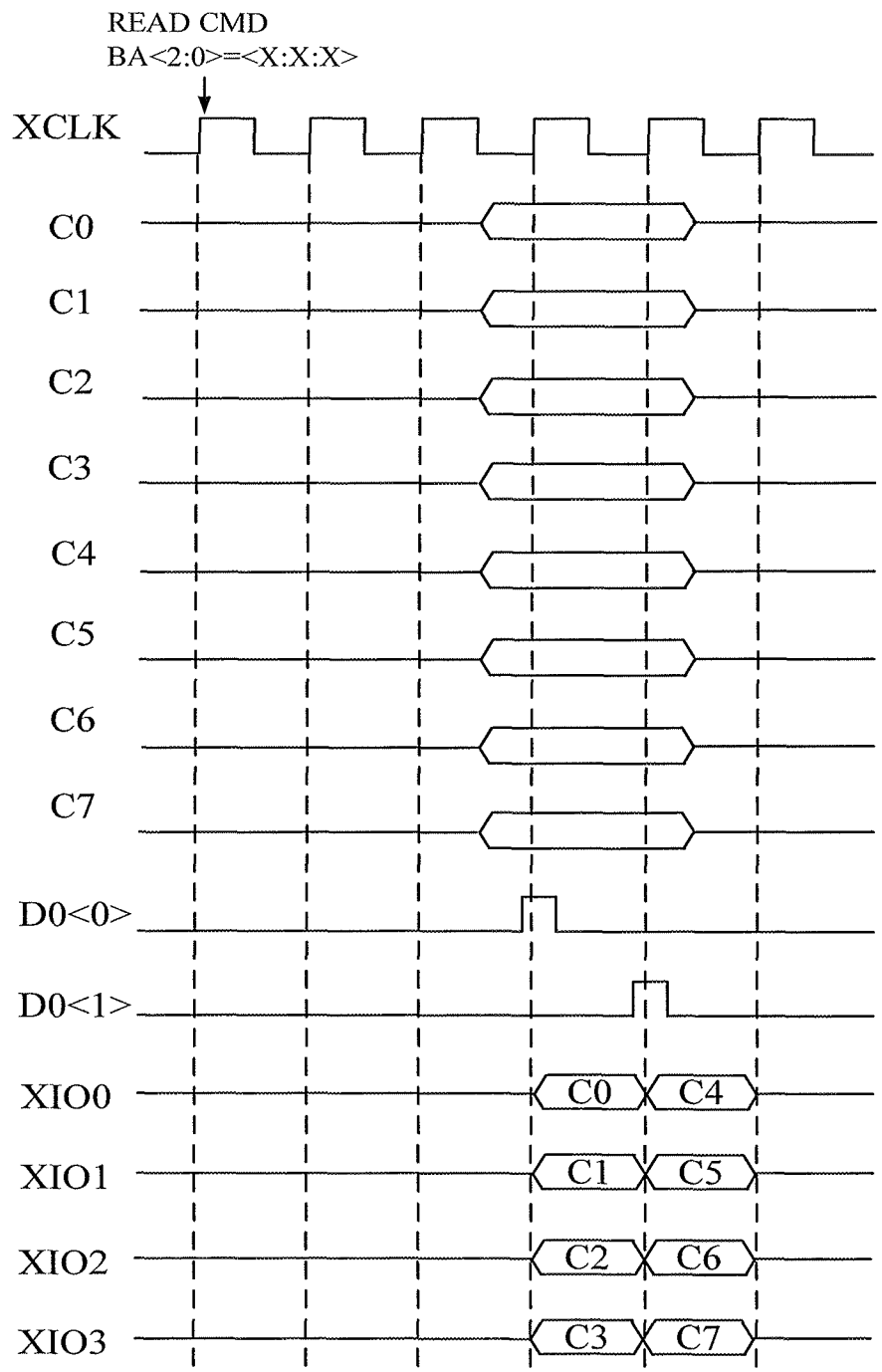
FIG. 17 is a timing diagram illustrating an operation of the memory device of FIG. 16.

FIG. 17 is a timing diagram illustrating an operation of the memory device of FIG. 16. Referring to FIG. 17, the sensing amplifiers in the memory unit 10'''' are simultaneously activated during two clock cycles. Therefore, the data read out from the first to eight banks 12_0 to 12_7 are simultaneously loaded on the local I/O buses LIO0<0:63> to LIO7<0:63> as shown in FIG. 16. Thereafter, the compression circuit 40 compresses the data loaded on the local I/O buses LIO0<0:63> to LIO7<0:63> and outputs the 1-bit compress-data C0 to C7 simultaneously as shown in FIG. 17.

In this embodiment, the signal distribution circuit distributes signals output from the compression circuit among four data pads in rotation. Therefore, refer to FIG. 12 and FIG. 17, when the first pulse of the timing signal D0<0> is generated, the signal C0 is transferred to the line X0, the signal C1 is transferred to the line X1, the signal C2 is transferred to the line X2, and the signal C3 is transferred to the line X3. Thereafter, the driving circuits 72 to 78 drive data loaded on the lines X0 to X3 to the lines XIO0 to XIO3, and the driven data loaded on the lines XIO0 to XIO3 are output to the outside through the test pads 30_0 to 30_3 in the compression test mode.

Figure 18:
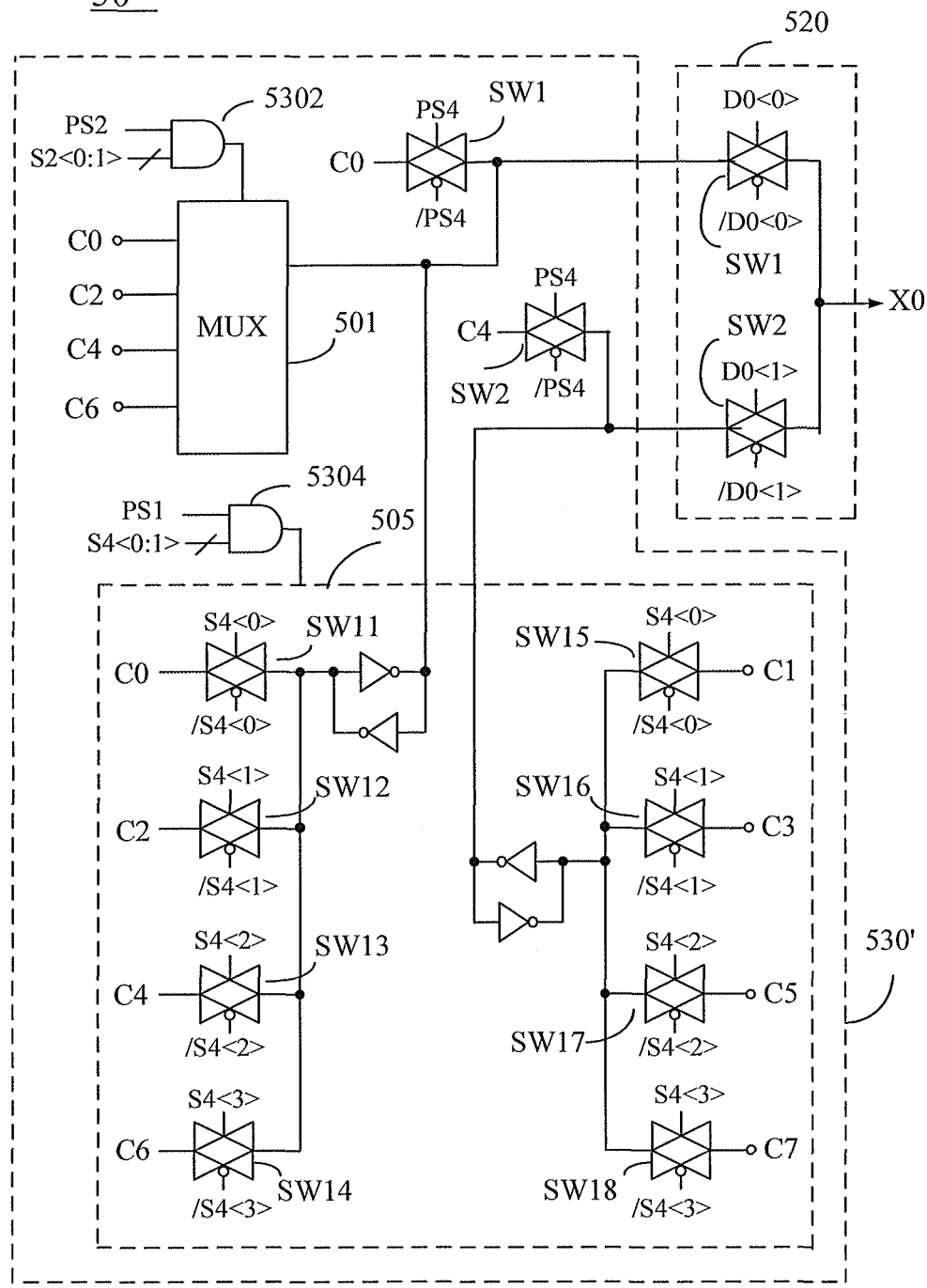
FIG. 18 is a circuit diagram showing an embodiment of a multiplexer unit of a signal distribution circuit.

According to another embodiment of the present invention, the signal distribution circuit can distribute signals output from the compression circuit 40 among a single data pad in rotation. Under this condition, some additional switches are required to vary signal transmission path. FIG. 18 is a circuit diagram showing a part of a signal distribution circuit 50''', wherein the signal distribution circuit 50''' comprises the same parts as the multiplexer units 531, 532, and 533 and the selector 520 of the signal distribution circuit 50" in FIG. 14 and a modified part as the multiplexer unit 530'. For the purpose of conciseness, since the multiplexer units 531, 532, and 533 are deactivated in this embodiment, they are not shown in FIG. 18.

Referring to FIG. 18, the multiplexer unit 530' comprises switches SW1 and SW2, AND circuits 5302 and 5304, and multiplexers 501 and 505. The multiplexer 505 comprises switches SW11, SW12, SW13, SW14, SW15, SW16, SW17, and SW18. The switches SW11 and SW15 are activated in response to a signal S4<0>, the switches SW12 and SW16 are activated in response to a signal S4<1>, the switches SW13 and SW17 are activated in response to a signal S4<2>, and the switches SW14 and SW18 are activated in response to a signal S4<3>, wherein the signals S4<0>, S4<1>, S4<2>, and S4<3> are output from the timing circuit 60.

The following describes the details of the operation of the signal distribution circuit 50'''. Since the compress-data of multiple memory banks are output to the test equipment through only one communication channel in this embodiment, the pad select signals PS2 and PS4 sent to the circuit 50''' are activated to a logic low level and a pad select signal PS1 sent to the circuit 50''' is activated to a logic high level. Under this condition, the multiplexer units 531, 532, and 533 are deactivated, so that no data arrive to the outside through the second to the fourth test pads 30_1 to 30_3. In addition, the multiplexer 501 in the multiplexer unit 530' is deactivated in response to a logic low level output from the AND circuit 5302 while the multiplexer 505 is activated in response to a logic high level output from the AND circuit 5304. Therefore, the signals C0 and C1 are sent to the selector 520 through the switches SW11 and SW15, respectively. The signals C2 and C3 are sent to the selector 520 through the switches SW12 and SW16, respectively. The signals C4 and C5 are sent to the selector 520 through the switches SW13 and SW17, respectively. The signals C6 and C7 are sent to the selector 520 through the switches SW14 and SW18, respectively.

Figure 19:
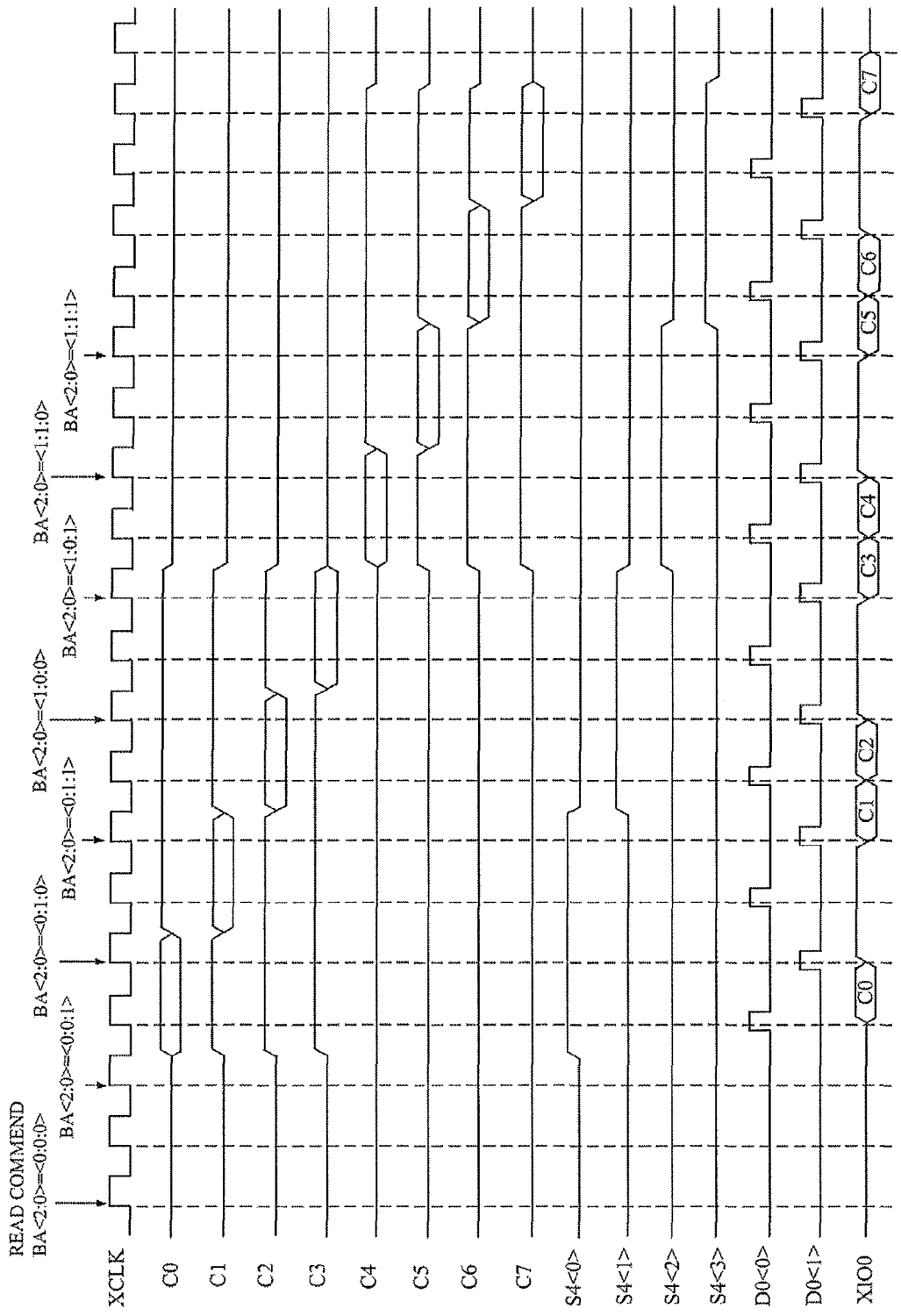
FIG. 19 is a timing diagram illustrating an operation of the memory device with the memory unit of FIG. 6 and the multiplexer unit of FIG. 18.

Referring now to FIG. 6, if the memory banks 12_0 to 12_7 in the memory unit 10' are divided into first to eighth groups GROUP_0 to GROUP_7, the compress-data of the first to eighth groups GROUP_0 to GROUP_7 are provided to the signal distribution circuit one by one every two clock cycles. FIG. 19 is a timing diagram illustrating an operation of the memory device with the memory unit 10' of FIG. 6 and the multiplexer unit 530' of FIG. 18. Referring to FIG. 19, if any one of the signals C0 and C1 is activated, the signal S4<0> output from the timing circuit 60 is activated to a logic high level, so that the switches SW11 and SW15 in FIG. 18 turn on in response to the timing signal S4<0>. In this case, the signals C0 and C1 are transferred to the selector 520 through the switches SW11 and SW13, respectively.

Referring to FIG. 19, the signal C0 is activated during the first two clock cycles. Thereafter, the activated signal C0 is transferred to the line X0 when the first pulse of the timing signal D0<0> is generated. The signal C1 is activated during the two successive clock cycles. Thereafter, the activated signal C1 is transferred to the line X0 when the second pulse of the timing signal D0<1> is generated.

Referring to FIG. 19, if any one of the signals C2 and C3 is activated, the signal S4<1> output from the timing circuit 60 is activated to a logic high level; if any one of the signals C4 and C5 is activated, the signal S4<2> output from the timing circuit 60 is activated to a logic high level; and if any one of the signals C6 and C7 is activated, the signal S4<> output from the timing circuit 60 is activated to a logic high level.

Therefore, during the successive clock cycles, the signals C2, C3, C4, C5, C6 and C7 are sequentially activated every two clock cycles, and the activated signals C2, C3, C4, C5, C6 and C7 are transferred to the line X0 when the corresponding pulses of the timing signals D0<0> and D0<1> are generated as shown in FIG. 19.

Figure 20:
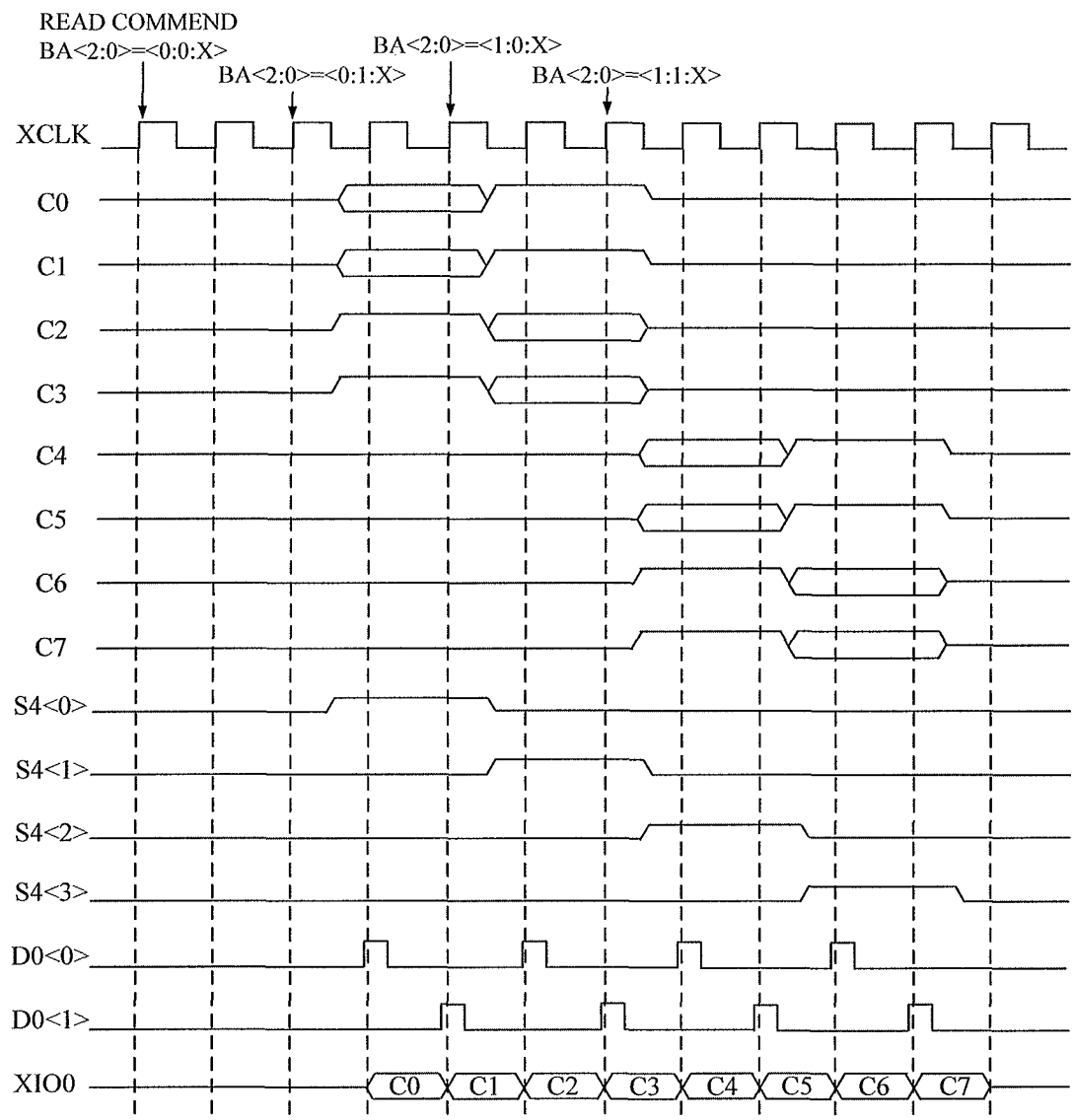
FIG. 20 is a timing diagram illustrating an operation of the memory device with the memory unit of FIG. 8 and the multiplexer unit of FIG. 18.

According to another embodiment of the present invention, the memory banks 12_0 to 12_7 in the memory unit are divided into first to fourth groups GROUP_0 to GROUP_3 as shown in FIG. 8. FIG. 20 is a timing diagram illustrating an operation of the memory device with the memory unit 10' of FIG. 8 and the multiplexer unit 530' of FIG. 18. Referring to FIG. 20, if the signals C0 and C1 of the memory banks 12_0 and 12_1 in the first group GROUP_0 are activated, the signal S4<0> output from the timing circuit 60 is activated to a logic high level; if the signals C2 and C3 of the memory banks 12_2 and 12_3 in the second group GROUP_1 are activated, the signal S4<1> output from the timing circuit 60 is activated to a logic high level; if the signals C4 and C5 of the memory banks 12_4 and 12_5 in the third group GROUP_2 are activated, the signal S4<2> output from the timing circuit 60 is activated to a logic high level; and if the signals C6 and C7 of the memory banks 12_6 and 12_7 in the fourth group GROUP_3 are activated, the signal S4<3> output from the timing circuit 60 is activated to a logic high level.

Referring to FIG. 20, the signals C0, C1, C2, C3, C4, C5, C6 and C7 in different groups are sequentially activated every two clock cycles, and thus the signal S4<0>, S4<1>, S4<2>, and S4<3> output from the timing circuit 60 are sequentially activated every two clock cycles. In this manner, the activated signals C0, C1, C2, C3, C4, C5, C6 and C7 are transferred to the line X0 every clock cycle when the corresponding pulses of the timing signals D0<0> and D0<1> are generated as shown in FIG. 20. As shown in FIG. 12, the driving circuit 72 drives data loaded on the line X0 to the line XIO0, and the driven data loaded on the line XIO0 are output to the outside through the test pads 30_0 in order of C0, C1, C2, C3, C4, C5, C6, and C7 in the compression test mode in this embodiment.

The above-described embodiments of the present invention are intended to be illustrative only. Numerous alternative embodiments may be devised by those skilled in the art without departing from the scope of the following claims.

What is claimed is:

1. A semiconductor memory device comprising:
   a memory unit comprising m memory banks divided into n activating groups, the memory banks in one of the n activating groups are activated simultaneously, wherein each memory bank comprises a plurality of sensing amplifiers for sensing and amplifying data in bit lines;
   i test pads;
   a timing circuit to sequentially generate n control signals each for activating a plurality of sensing amplifiers in one of the n activating groups;
   a compression circuit to compress data sensed and amplified by the plurality of sensing amplifiers in each memory bank in a compression test mode; and
   a signal distribution circuit to distribute signals output from the compression circuit among the i test pads in rotation;
   wherein m is a positive integer, n is a positive integer having a value of 1 or greater, and i is a positive integer having a value of 1 or greater,
   wherein when the number of the memory banks in one of the n activating groups is greater than 1, the i test pads generate one-bit compress-data of the memory banks in the one of the n activating groups simultaneously, and
   wherein when the number of the memory banks in one of the n activating groups is equal to 1, each of the i test pads generates one-bit compress-data of the one memory bank in the one of the n activating groups by delaying a corresponding control signal at different clock cycles.

2. The semiconductor memory device of claim 1, wherein the memory unit comprises first to eighth memory banks, and the compression circuit outputs 1-bit compress-data of the first to eighth memory banks in order of C0, C1, C2, C3, C4, C5, C6, and C7.

3. The semiconductor memory device of claim 2, wherein the integer i is selected to be two, the test pads comprising first and second test pads are connected to two communication channels from a test equipment, and the signal distribution circuit outputs the 1-bit compress-data of the first, third, fifth, and seventh memory banks in order of C0, C2, C4, and C6 to the first test pad, and outputs the 1-bit compress-data of the second, fourth, sixth, and eighth memory banks in order of C1, C3, C5, and C7 to the second test pad.

4. The semiconductor memory device of claim 2, wherein the integer i is selected to be four, the test pads comprising first, second, third, and fourth test pads are connected to four communication channels from a test equipment, and the signal distribution circuit outputs the 1-bit compress-data of the first and fifth memory banks in order of C0 and C4 to the first test pad, outputs the 1-bit compress-data of the second and sixth memory banks in order of C1 and C5 to the second test pad, outputs the 1-bit compress-data of the third and seventh memory banks in order of C2 and C6 to the third test pad, and outputs the 1-bit compress-data of the fourth and eighth memory banks in order of C3 and C7 to the fourth test pad.

5. The semiconductor memory device of claim 1, wherein each bank comprises a plurality of local input/output lines provided corresponding to the sensing amplifiers in each bank, the compression circuit comprises first and second compressors, and the semiconductor memory device comprises a plurality of global input/output lines provided in common to the m memory banks, wherein data loaded on a portion of the local input/output lines in one of the memory banks are compressed and transferred to one of the global input/output lines by the first compressor and data loaded on a portion of the global input/output lines are compressed and transferred to the signal distribution circuit by the second compressor in the compression test mode.

6. The semiconductor memory device of claim 2, wherein the test pads are composed of first, second, third, and fourth test pads, and the signal distribution circuit comprises:
  a first multiplexer to receive compress-data C0, C2, C4, and C6;
  a second multiplexer to receive compress-data C1, C3, C5, and C7;
  a third multiplexer to receive compress-data C2, and C6;
  a fourth multiplexer to receive compress-data C3, and C7;
  a first selector coupled between the first multiplexer and the first test pad;
  a second selector coupled between the second multiplexer and the second test pad;
  a third selector coupled between the third multiplexer and the third test pad; and
  a fourth selector coupled between the fourth multiplexer and the fourth test pad;
  wherein the integer i is selected to be one, two or four corresponding to the number of communication channels for testing the semiconductor memory device in the compression test mode.

7. The semiconductor memory device of claim 6, wherein the integer i is selected to be two, the first to eighth memory banks are divided into eight activating groups, and the timing circuit sequentially generates eight control signals to activate the sensing amplifiers in each activating group every two clock cycles.

8. The semiconductor memory device of claim 7, wherein when the sensing amplifiers in one of the first, second, third, and fourth activating groups are activated, the first multiplexer drives the compress-data C0 and C2 to the first selector, and the second multiplexer drives the compress-data C1 and C3 to the second selector; when the sensing amplifiers in one of the fifth, sixth, seventh, and eighth activating groups are activated, the first multiplexer drives the compress-data C4 and C6 to the first selector, the second multiplexer drives the compress-data C5 and C7 to the second selector; the first selector drives one of the compress-data C0, C2, C4, and C6 to the first pad when one of the compress-data C0, C2, C4, and C6 is activated, and the second selector drives one of the compress-data C1, C3, C5, and C7 to the second pad when one of the compress-data C1, C3, C5, and C7 is activated.

9. The semiconductor memory device of claim 6, wherein the integer i is selected to be two, the first to eighth memory banks are divided into four activating groups, and the timing circuit sequentially generates four control signals to activate the sensing amplifiers in each activating group every two clock cycles.

10. The semiconductor memory device of claim 9, wherein when the sensing amplifiers in one of the first and second activating groups are activated, the first multiplexer drives the compress-data C0 and C2 to the first selector, and the second multiplexer drives the compress-data C1 and C3 to the second selector; when the sensing amplifiers in one of the third and fourth activating groups are activated, the first multiplexer drives the compress-data C4 and C6 to the first selector, and the second multiplexer drives the compress-data C5 and C7 to the second selector; the first selector drives one of the compress-data C0, C2, C4, and C6 to the first test pad when one of the compress-data C0, C2, C4, and C6 is activated, and the second selector drives one of the compress-data C1, C3, C5, and C7 to the second test pad when one of the compress-data C1, C3, C5, and C7 is activated.

11. The semiconductor memory device of claim 6, wherein the integer i is selected to be two, the first to eighth memory banks are divided into two activating groups, and the timing circuit sequentially generates two control signals to activate the sensing amplifiers in each activating group every two clock cycles.

12. The semiconductor memory device of claim 11, wherein when the sensing amplifiers in the first activating group are activated, the first multiplexer drives the compress-data C0 and C2 to the first selector, and the second multiplexer drives the compress-data C1 and C3 to the second selector; when the sensing amplifiers in the second activating group are activated, the first multiplexer drives the compress-data C4 and C6 to the first selector, and the second multiplexer drives the compress-data C5 and C7 to the second selector; the first selector drives the compress-data in order of C0, C2, C4, and C6 to the first test pad every clock cycle when the sensing amplifiers in the first activating group are activated, and the second selector drives the compress-data in order of C1, C3, C5, and C7 to the second pad every clock cycle when the sensing amplifiers in the second activating group are activated.

13. The semiconductor memory device of claim 6, wherein the integer i is selected to be four, and the sensing amplifiers in each memory bank are simultaneously activated.

14. The semiconductor memory device of claim 13, wherein the first multiplexer drives the compress-data C0 and C4 to the first selector, the second multiplexer drives the compress-data C1 and C5 to the second selector, the third multiplexer drives the compress-data C2 and C6 to the third selector, and the fourth multiplexer drives the compress-data C3 and C7 to the fourth selector; the first selector drives the compress-data in order of C0 and C4 to the first test pad every clock cycle, the second selector drives the compress-data in order of C1 and C5 to the second pad every clock cycle, the third selector drives the compress-data in order of C2 and C6 to the third pad every clock cycle, and the fourth selector drives the compress-data in order of C3 and C7 to the fourth selector every clock cycle.

15. The semiconductor memory device of claim 2, wherein the integer i is selected to be one, the test pad is connected to a single communication channel from a test equipment, and the signal distribution circuit outputs the 1-bit compress-data of the first, to seventh memory banks in order of C0, C1, C2, C3, C4, C5, C6, and C7 to the test pad.

16. The semiconductor memory device of claim 6, wherein the signal distribution circuit further comprises:
a fifth multiplexer to receive the 1-bit compress-data C0, C1, C2, C3, C4, C5, C6 and C7;
wherein the first selector is coupled between the fifth multiplexer and the first test pad.

17. The semiconductor memory device of claim 16, wherein the integer i is selected to be one, the first to eighth memory banks are divided into eight activating groups, and the timing circuit sequentially generates eight control signals to activate the sensing amplifiers in each activating group every two clock cycles.

18. The semiconductor memory device of claim 17, wherein when the sensing amplifiers in one of the first and second activating groups are activated, the fifth multiplexer drives the compress-data C0 and C1 to the first selector, when the sensing amplifiers in one of the third and fourth activating groups are activated, the fifth multiplexer drives the compress-data C2 and C3 to the first selector, when the sensing amplifiers in one of the fifth and sixth activating groups are activated, the fifth multiplexer drives the compress-data C4 and C5 to the first selector, and when the sensing amplifiers in one of the seventh and eighth activating groups are activated, the fifth multiplexer drives the compress-data C6 and C7 to the first selector; the first selector drives one of the compress-data C0, C1, C2, C3, C4, C5, C6, and C7 to the first test pad when one of them is activated.

19. The semiconductor memory device of claim 16, wherein the integer i is selected to be one, the first to eighth memory banks are divided into four activating groups, and the timing circuit sequentially generates four control signals to activate the sensing amplifiers in each activating group every two clock cycles.

20. The semiconductor memory device of claim 19, wherein when the sensing amplifiers in the first activating groups are activated, the fifth multiplexer drives the compress-data C0 and C1 to the first selector, when the sensing amplifiers in the second activating groups are activated, the fifth multiplexer drives the compress-data C2 and C3 to the first selector, when the sensing amplifiers in the third activating groups are activated, the fifth multiplexer drives the compress-data C4 and C5 to the first selector, and when the sensing amplifiers in the fourth activating groups are activated, the fifth multiplexer drives the compress-data C6 and C7 to the first selector; the first selector drives one of the compress-data C0, C1, C2, C3, C4, C5, C6, and C7 to the first test pad every clock cycle when one of them is activated.

* * * * *